(12) United States Patent
Raynor

(10) Patent No.: US 9,813,631 B2
(45) Date of Patent: Nov. 7, 2017

(54) IMAGE SENSOR CONFIGURATION

(71) Applicant: STMicroelectronics (Research & Development) Limited, Marlow (GB)

(72) Inventor: Jeffrey M. Raynor, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 0 days.

(21) Appl. No.: 15/151,240

(22) Filed: May 10, 2016

(65) Prior Publication Data

US 2017/0187936 A1    Jun. 29, 2017

(30) Foreign Application Priority Data

Dec. 23, 2015 (EP) .................................... 15202555

(51) Int. Cl.
*H04N 5/235* (2006.01)
*H04N 9/04* (2006.01)
*H01L 27/146* (2006.01)

(52) U.S. Cl.
CPC ....... *H04N 5/235* (2013.01); *H01L 27/14609* (2013.01); *H01L 27/14643* (2013.01); *H04N 5/2353* (2013.01); *H04N 9/045* (2013.01)

(58) Field of Classification Search
CPC ...... H04N 5/235; H04N 9/045; H04N 5/2353; H04N 5/2355; H04N 5/2356; H04N 5/355; H04N 5/35536; H04N 5/35545; H04N 5/35554; H04N 5/35572; H04N 5/35581; H04N 5/378; H04N 5/372; H04N 5/3535; H04N 5/3537; H04N 5/3745; H01L 27/14609; H01L 27/14643
See application file for complete search history.

(56) References Cited

U.S. PATENT DOCUMENTS

| | | | | |
|---|---|---|---|---|
| 7,697,051 B2* | 4/2010 | Krymski | ........... | H01L 27/14609 250/208.1 |
| 7,808,536 B2* | 10/2010 | Yamada | ................ | H04N 5/232 250/208.1 |
| 2010/0188491 A1* | 7/2010 | Shizukuishi | ............. | A61B 1/05 348/65 |
| 2013/0075590 A1* | 3/2013 | Compton | ............. | H04N 5/3535 250/208.1 |

FOREIGN PATENT DOCUMENTS

| EP | 2 579 580 A1 | 4/2013 |
|---|---|---|
| EP | 2 822 268 A2 | 1/2015 |
| EP | 2 858 348 A1 | 4/2015 |
| EP | 2 866 007 A2 | 4/2015 |

* cited by examiner

*Primary Examiner* — Albert Cutler
(74) *Attorney, Agent, or Firm* — Seed IP Law Group LLP

(57) ABSTRACT

An image sensor has an array of light-sensitive pixels. Each pixel of the array includes a photodiode and a plurality of capacitors configured to store charge from the photodiode. The image sensor has an address decoder, coupled to the array of light-sensitive pixels. In at least one mode of operation, portions of the array of light-sensitive pixels to capture respective image exposures. The portions may include interlaced rows of pixels of the array of light-sensitive pixels, blocks of rows of pixels of the array of light-sensitive pixels, interlaced columns of pixels of the array of light-sensitive pixels, interlaced columns and rows of pixels of the array of light-sensitive pixels, blocks of columns and rows of pixels of the array of light-sensitive pixels, etc.

25 Claims, 21 Drawing Sheets

IMAGE SENSOR CONFIGURATION

BACKGROUND

Technical Field

Some embodiments relate to an image sensor configuration and image sensor structure.

Description of the Related Art

Image sensors using photodiode pixels, for example implemented in CMOS architecture, are known. Such image sensors have many applications. In some applications, an array of pixels may be provided.

BRIEF SUMMARY

In an embodiment, an image sensor comprises: an array of photodiode pixels configured to be sensitive to light, each pixel comprising a photodiode, and a plurality of capacitors configured to store charge from the photodiode; and an address decoder configured to control the array of photodiode pixels such that the array of photodiode pixels may be divided into two or more parts, each part separately controlled to take at least one exposure separate from each other part.

In an embodiment, the address decoder may comprise a plurality of row decoders, the row decoders associated with a row of the photodiode pixels and comprising: a latch configured to store a row type value; and row type circuitry configured to receive a row type input and configured to enable row address circuitry based on the row type input value matching the latch row type value; and row address circuitry configured to receive a row address signal and, when enabled by the row type circuitry to selectively enable rows of the photodiode array based on the row address input signal value matching a determined row value.

In an embodiment, the address decoder may be configured to divide the array of photodiode pixels into: interlaced rows of photodiode pixels; and blocks of rows of photodiode pixels.

In an embodiment, the address decoder may comprise a plurality of row decoders, and wherein neighboring pixels within each row of the array may be controlled by separate row decoders, each row decoder comprising: a latch configured to store a row type value; and row type circuitry configured to receive a row type input and configured to enable row address circuitry based on the row type input value matching the latch row type value; and row address circuitry configured to receive a row address signal and, when enabled by the row type circuitry to selectively enable rows of the photodiode array based on the row address input signal value matching a determined row value.

In an embodiment, the address decoder may be configured to divide the array of photodiode pixels into: interlaced columns of photodiode pixels; interlaced columns and rows of photodiode pixels; and blocks or columns and rows of photodiode pixels.

In an embodiment, the plurality of capacitors configured to store charge from the photodiode may be one of: two capacitors, a first capacitor configured to store a photodiode charge for a first exposure and a second capacitor configured to store a reset noise charge associated with the first exposure; two capacitors, a first capacitor configured to store a photodiode charge for a first exposure and a second capacitor configured to store a photodiode charge for a second exposure; four capacitors, a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and four capacitors, a first capacitor configured to store a photodiode charge for a first exposure, a second capacitor configured to store a photodiode charge for a second exposure, a third capacitor configured to store a photodiode charge for a third exposure, a fourth capacitor configured to store a photodiode charge for a fourth exposure.

In an embodiment, the array of photodiode pixels may be one of a global shutter pixel array and a rolling blade pixel.

In an embodiment, an image sensor system may comprise: the image sensor as discussed herein; a plurality of illumination sources, each illumination source associated with a separate wavelength range; and a controller configured to control the image sensor and the plurality of illumination sensors to take separate exposures as each illumination source is selectively activated.

In an embodiment, a method of capturing separate exposure images within an image sensor comprises: providing an array of photodiode pixels configured to be sensitive to light, each pixel comprising: a photodiode; and a plurality of capacitors configured to store charge from the photodiode; and controlling the array of photodiode pixels such that the array of photodiode pixels may be divided into two or more parts, each part separately controlled to take at least one exposure separate from each other part.

In an embodiment, controlling the array of photodiode pixels may comprise providing a plurality of row decoders, the row decoders associated with a row of the photodiode pixels, and the method may comprise: storing a row type value in each row decoder; receiving a row type input; receiving a row address signal; and selectively enabling rows of the photodiode array based on the row address input signal value matching a determined row value and the row type input value matching the row type value.

In an embodiment, controlling the array of photodiode pixels may comprise at least one of: dividing the array of photodiode pixels into interlaced rows of photodiode pixels; and dividing the array of photodiode pixels into blocks of rows of photodiode pixels.

In an embodiment, controlling the array of photodiode pixels may comprise separately controlling neighboring pixels within each row of the array by providing a two or more row decoders for each row to control neighboring pixels within each row the method may comprise: storing a row type value in each row decoder; receiving a row type input; receiving a row address signal; and selectively enabling pixels within the rows of the photodiode array based on the row address input signal value matching a determined row value and the row type input value matching the row type value.

In an embodiment, controlling the array of photodiode pixels may comprise at least one of: dividing the array of photodiode pixels into interlaced columns of photodiode pixels; dividing the array of photodiode pixels into interlaced columns and rows of photodiode pixels; and dividing the array of photodiode pixels into blocks or columns and rows of photodiode pixels.

In an embodiment, controlling the array of photodiode pixels may comprise controlling the plurality of capacitors configured to store charge from the photodiode in at least one of the following ways: when the pixel comprises two capacitors, controlling a first capacitor to store a photodiode charge for a first exposure and controlling a second capacitor to store a reset noise charge associated with the first exposure; when the pixel comprises two capacitors, controlling a first capacitor to store a photodiode charge for a first exposure and controlling a second capacitor to store a photodiode charge for a second exposure; when the pixel comprises four capacitors, controlling a first capacitor to store a photodiode charge for a first exposure, controlling a second capacitor to store a reset noise charge associated with the first exposure, controlling a third capacitor to store a photodiode charge for a second exposure and controlling a fourth capacitor to store a reset noise charge associated with the second exposure; and when the pixel comprises four capacitors, controlling a first capacitor to store a photodiode charge for a first exposure, controlling a second capacitor to store a photodiode charge for a second exposure, controlling a third capacitor to store a photodiode charge for a third exposure, controlling a fourth capacitor to store a photodiode charge for a fourth exposure.

In an embodiment, the method may comprise: providing a plurality of illumination sources, each illumination source associated with a separate wavelength range; and controlling the array of photodiode pixels and plurality of illumination sensors to take separate exposures as each illumination source is selectively activated.

In an embodiment, an apparatus to capture separate exposure images within an image sensor comprises: means for providing an array of photodiode pixels configured to be sensitive to light, each pixel comprising: a photodiode; and a plurality of capacitors configured to store charge from the photodiode; and means for controlling the array of photodiode pixels such that the array of photodiode pixels may be divided into two or more parts, each part separately controlled to take at least one exposure separate from each other part.

In an embodiment, the means for controlling the array of photodiode pixels may comprise means for providing a plurality of row decoders, the row decoders associated with a row of the photodiode pixels, and the means for controlling may comprise: means for storing a row type value in each row decoder; means for receiving a row type input; means for receiving a row address signal; and means for selectively enabling rows of the photodiode array based on the row address input signal value matching a determined row value and the row type input value matching the row type value.

In an embodiment, the means for controlling the array of photodiode pixels may comprise at least one of: means for dividing the array of photodiode pixels into interlaced rows of photodiode pixels; and means for dividing the array of photodiode pixels into blocks of rows of photodiode pixels.

In an embodiment, the means for controlling the array of photodiode pixels may comprise means for separately controlling neighboring pixels within each row of the array by providing a two or more row decoders for each row to control neighboring pixels within each row the means for controlling may comprise: means for storing a row type value in each row decoder; means for receiving a row type input; means for receiving a row address signal; and means for selectively enabling pixels within the rows of the photodiode array based on the row address input signal value matching a determined row value and the row type input value matching the row type value.

In an embodiment, the means for controlling the array of photodiode pixels may comprise at least one of: means for dividing the array of photodiode pixels into interlaced columns of photodiode pixels; means for dividing the array of photodiode pixels into interlaced columns and rows of photodiode pixels; and means for dividing the array of photodiode pixels into blocks or columns and rows of photodiode pixels.

In an embodiment, the means for controlling the array of photodiode pixels may comprise controlling the plurality of capacitors configured to store charge from the photodiode in at least one of the following ways: when the pixel comprises two capacitors, controlling a first capacitor to store a photodiode charge for a first exposure and controlling a second capacitor to store a reset noise charge associated with the first exposure; when the pixel comprises two capacitors, controlling a first capacitor to store a photodiode charge for a first exposure and controlling a second capacitor to store a photodiode charge for a second exposure; when the pixel comprises four capacitors, controlling a first capacitor to store a photodiode charge for a first exposure, controlling a second capacitor to store a reset noise charge associated with the first exposure, controlling a third capacitor to store a photodiode charge for a second exposure and controlling a fourth capacitor to store a reset noise charge associated with the second exposure; and when the pixel comprises four capacitors, controlling a first capacitor to store a photodiode charge for a first exposure, controlling a second capacitor to store a photodiode charge for a second exposure, controlling a third capacitor to store a photodiode charge for a third exposure, controlling a fourth capacitor to store a photodiode charge for a fourth exposure.

In an embodiment, the apparatus may comprise: a plurality of illumination sources, each illumination source associated with a separate wavelength range; and means for controlling the array of photodiode pixels and plurality of illumination sensors to take separate exposures as each illumination source is selectively activated.

In an embodiment, a device, comprises: an array of light-sensitive pixels, each pixel of the array including: a photodiode; and a plurality of capacitors configured to store charge from the photodiode; and an address decoder, coupled to the array of light-sensitive pixels, and which, in at least one mode of operation, controls a plurality of portions of the array of light-sensitive pixels to capture respective image exposures. In an embodiment, the address decoder comprises a plurality of row decoders, each row decoder associated with a respective row of the array of light-sensitive pixels and including: a memory configured to store row-decoder enablement information; enablement circuitry configured to receive a type signal and to generate an enable signal based on the type signal and the stored row-decoder enablement information; and address circuitry configured to receive a row-address signal and the enable signal, and to selectively enable the respective row of the array of light sensitive pixels based on the row-address signal and the enable signal. In an embodiment, the at least one mode of operation comprises at least one of: a mode of operation wherein the plurality of portions comprise interlaced rows of pixels of the array of light-sensitive pixels; and a mode of operation wherein the plurality of portions comprise blocks of rows of pixels of the array of light-sensitive pixels. In an embodiment, the address decoder comprises a plurality of row decoders, and wherein neighboring pixels within each row of the array of light-sensitive pixels are controlled by separate row decoders, each row decoder including: a memory configured to store row-decoder enablement information; enablement circuitry configured to receive a type signal and to generate an enable signal based on the type signal and the stored row-decoder enablement information; and address circuitry configured to receive a row-address signal and the enable signal, and to selectively enable pixels of the array of light sensitive pixels controlled by the row decoder based on the row-address signal and the enable signal. In an embodiment, the at least one mode of operation comprises at least one of: a mode of operation wherein the plurality of portions comprise interlaced columns of pixels of the array of light-sensitive pixels; a mode of operation wherein the plurality of portions comprise interlaced columns and rows of pixels of the array of light-sensitive pixels; and a mode of operation wherein the plurality of portions comprise blocks of columns and rows of pixels of the array of light-sensitive pixels. In an embodiment, the plurality of capacitors comprises one or more of: a first capacitor configured to store a photodiode charge for a first exposure and a second capacitor configured to store a reset noise charge associated with the first exposure; a first capacitor configured to store a photodiode charge for a first exposure and a second capacitor configured to store a photodiode charge for a second exposure; a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and a first capacitor configured to store a photodiode charge for a first exposure, a second capacitor configured to store a photodiode charge for a second exposure, a third capacitor configured to store a photodiode charge for a third exposure and a fourth capacitor configured to store a photodiode charge for a fourth exposure. In an embodiment, the array of light-sensitive pixels comprises at least one of: a global shutter pixel array; and a rolling blade pixel.

In an embodiment, a system comprises: an array of light-sensitive pixels, each pixel of the array including: a photodiode; and a plurality of capacitors configured to store charge from the photodiode; a plurality of illumination sources; and control circuitry, coupled to the array of light-sensitive pixels and the plurality of illumination sources, and which, in at least one mode of operation, controls a plurality of portions of the array of light-sensitive pixels and the plurality of illumination sources to capture respective image exposures. In an embodiment, each illumination source of the plurality of illumination sources is associated with a separate wavelength range. In an embodiment, the control circuitry comprises a plurality of row decoders, each row decoder associated with a respective row of the array of light-sensitive pixels and including: a memory configured to store row-decoder enablement information; enablement circuitry configured to receive a type signal and to generate an enable signal based on the type signal and the stored row-decoder enablement information; and address circuitry configured to receive a row-address signal and the enable signal, and to selectively enable the respective row of the array of light sensitive pixels based on the row-address signal and the enable signal. In an embodiment, the at least one mode of operation comprises at least one of: a mode of operation wherein the plurality of portions comprise interlaced rows of pixels of the array of light-sensitive pixels; and a mode of operation wherein the plurality of portions comprise blocks of rows of pixels of the array of light-sensitive pixels. In an embodiment, the control circuitry comprises a plurality of row decoders, and wherein neighboring pixels within each row of the array of light-sensitive pixels are controlled by separate row decoders, each row decoder including: a memory configured to store row-decoder enablement information; enablement circuitry configured to receive a type signal and to generate an enable signal based on the type signal and the stored row-decoder enablement information; and address circuitry configured to receive a row-address signal and the enable signal, and to selectively enable pixels of the array of light sensitive pixels controlled by the row decoder based on the row-address signal and the enable signal. In an embodiment, the at least one mode of operation comprises at least one of: a mode of operation wherein the plurality of portions comprise interlaced columns of pixels of the array of light-sensitive pixels; a mode of operation wherein the plurality of portions comprise interlaced columns and rows of pixels of the array of light-sensitive pixels; and a mode of operation wherein the plurality of portions comprise blocks of columns and rows of pixels of the array of light-sensitive pixels. In an embodiment, the plurality of capacitors comprises one or more of: a first capacitor configured to store a photodiode charge for a first exposure and a second capacitor configured to store a reset noise charge associated with the first exposure; a first capacitor configured to store a photodiode charge for a first exposure and a second capacitor configured to store a photodiode charge for a second exposure; a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and a first capacitor configured to store a photodiode charge for a first exposure, a second capacitor configured to store a photodiode charge for a second exposure, a third capacitor configured to store a photodiode charge for a third exposure and a fourth capacitor configured to store a photodiode charge for a fourth exposure.

In an embodiment, a method, comprising: controlling, using an address decoder, a plurality of portions of an array of light-sensitive pixels to respectively capture a plurality of image exposures, each pixel of the array including: a photodiode; and a plurality of capacitors configured to store charge from the photodiode; and storing the captured plurality of image exposures. In an embodiment, the method comprises, for each row of the array of light sensitive pixels: generating an enable signal based on stored row-enablement information and a received row-type signal; and selectively enabling the row based on a row-address signal and the generated enable signal. In an embodiment, the plurality of portions comprise at least one of: interlaced rows of pixels of the array of light-sensitive pixels; and blocks of rows of pixels of the array of light-sensitive pixels. In an embodiment, the address decoder comprises a plurality of row decoders, and wherein neighboring pixels within each row of the array of light-sensitive pixels are controlled by separate row decoders, the method comprising, for each row decoder: generating an enable signal for the row decoder based on a type signal and stored enablement information for the row decoder; and selectively enabling pixels of the array of light sensitive pixels controlled by the row decoder based on a row-address signal and the enable signal. In an embodiment, the plurality of portions comprise at least one of: interlaced columns of pixels of the array of light-sensitive pixels; interlaced columns and rows of pixels of the array of light-sensitive pixels; and blocks of columns and rows of pixels of the array of light-sensitive pixels. In an embodiment, the method comprises at least one of: storing a photodiode charge for a first exposure to a first capacitor of a pixel and storing a reset noise charge associated with the first exposure to a second capacitor of the pixel; and storing the photodiode charge for the first exposure to the first capacitor of the pixel and storing a photodiode charge for a second exposure to a second capacitor of the pixel. In an embodiment, the method comprises: controlling a plurality of illumination sources during the capturing of the plurality of image exposures.

BRIEF DESCRIPTION OF THE SEVERAL VIEWS OF THE DRAWINGS

Reference is now made by way of example only to the accompanying drawings in which.

DETAILED DESCRIPTION

CMOS image sensors (CIS) are configured to measure the intensity of light over two dimensions. Existing consumer devices may have color imaging and spectral responses determined by the color filter materials on (or over layered on) the pixels. The filter material degrades the spatial response as an individual pixel is sensitive to only a specific wavelength and the spectral bandwidth of the pixel is relatively large (in the order of 100 nm). Furthermore the choice of the spectral filtering or colors is limited as dyes which can be patterned to small pixels (in the order of 1-5 µm) are limited. Furthermore typically used dyes such as red, green, and blue are transparent in infrared and thus are limited in spectral resolution.

A possible approach to overcome the spatial response issues is to illuminate the subject with band-limited light sources. However this may require the device to take multiple exposures which may require a significant capture time of the image with associated potential blurring of the subject.

An embodiment comprises a cost-effective device which can obtain two-dimensional images of objects at different wavelengths of light (or more generally images of objects with different exposure variables) at rapid speeds.

Figure 1:
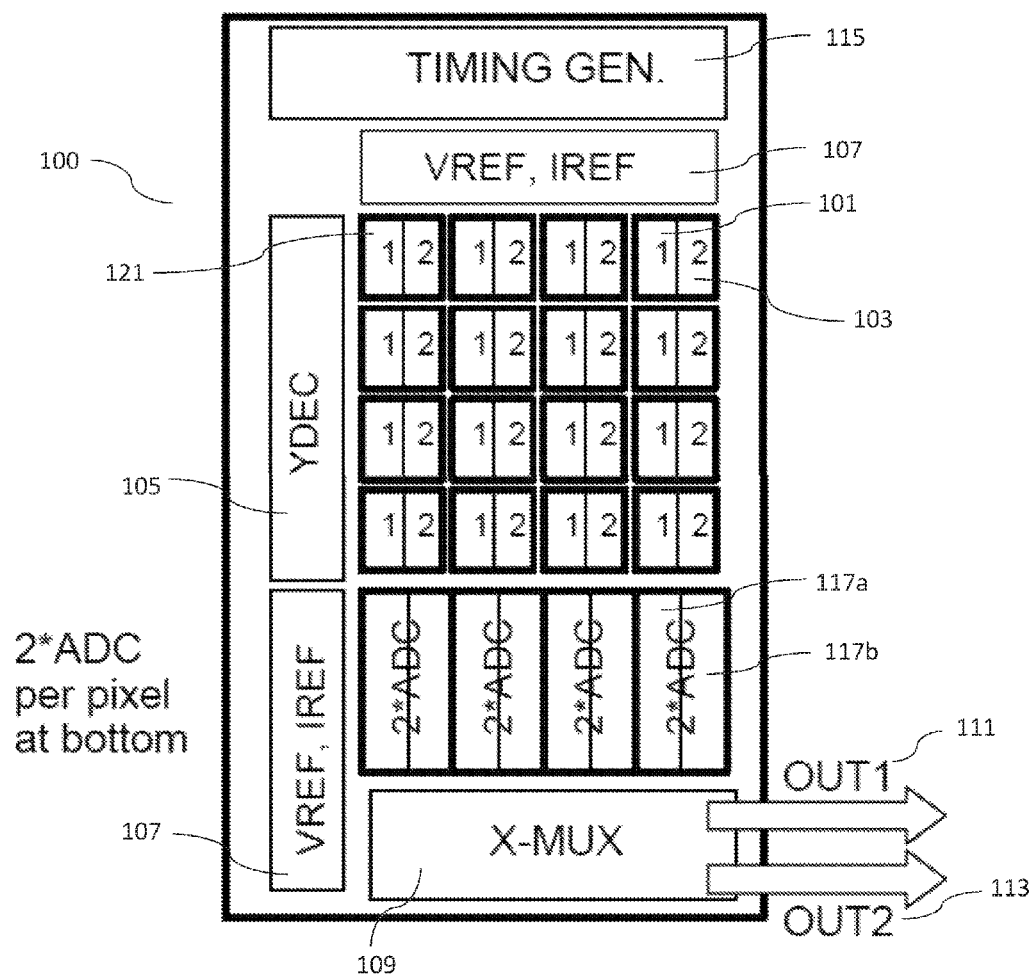
FIG. 1 shows an example two storage element sensor arrangement.

With respect to FIG. 1 an example two storage element sensor arrangement is shown. The sensor 100 shows a global shutter sensor with an array of pixels 121, each pixel comprising 2 storage elements shown as storage element 1 101, and storage element 2 103. The output from each of the first and second storage elements 101, 103 of each pixel can for example be passed to a first 117a and second 117b analog to digital converter (ADC) 117. The output of the ADC 117 may be passed to a column multiplexer (X-MUX) 109 which is configured to multiplex the outputs of the ADC 117 and provide them on a first and second output 111, 113 respectively.

The sensor may further comprise a voltage and current reference (VREF, IREF) generator 107 and furthermore a row decoder (YDEC) 105. The YDEC 105 can receive signals from the timing generator 115 to control the sampling period and read out from the pixels.

Figure 4:
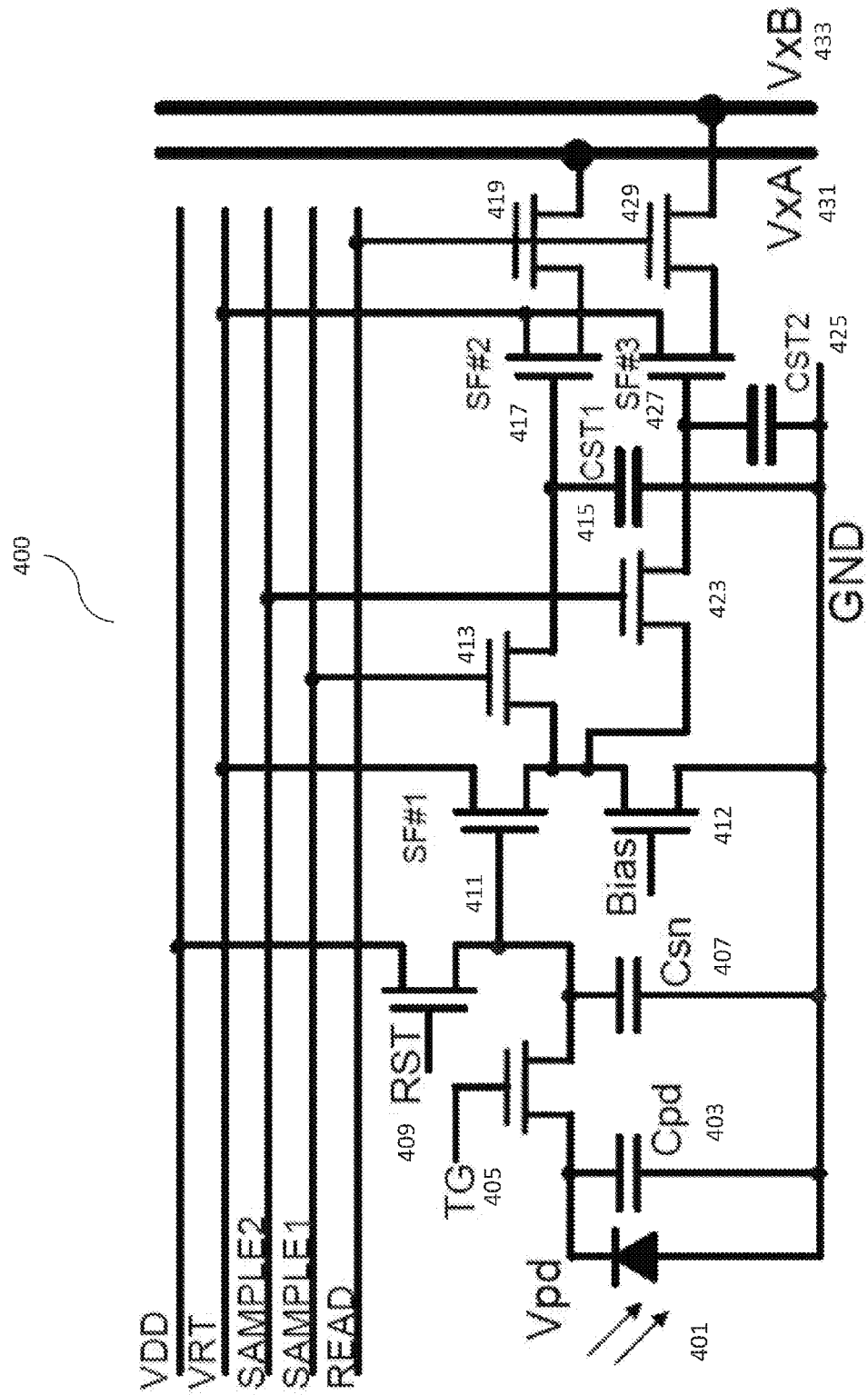
FIG. 4 shows an example two storage element voltage-domain global shutter pixel sensor arrangement.
Figure 5:
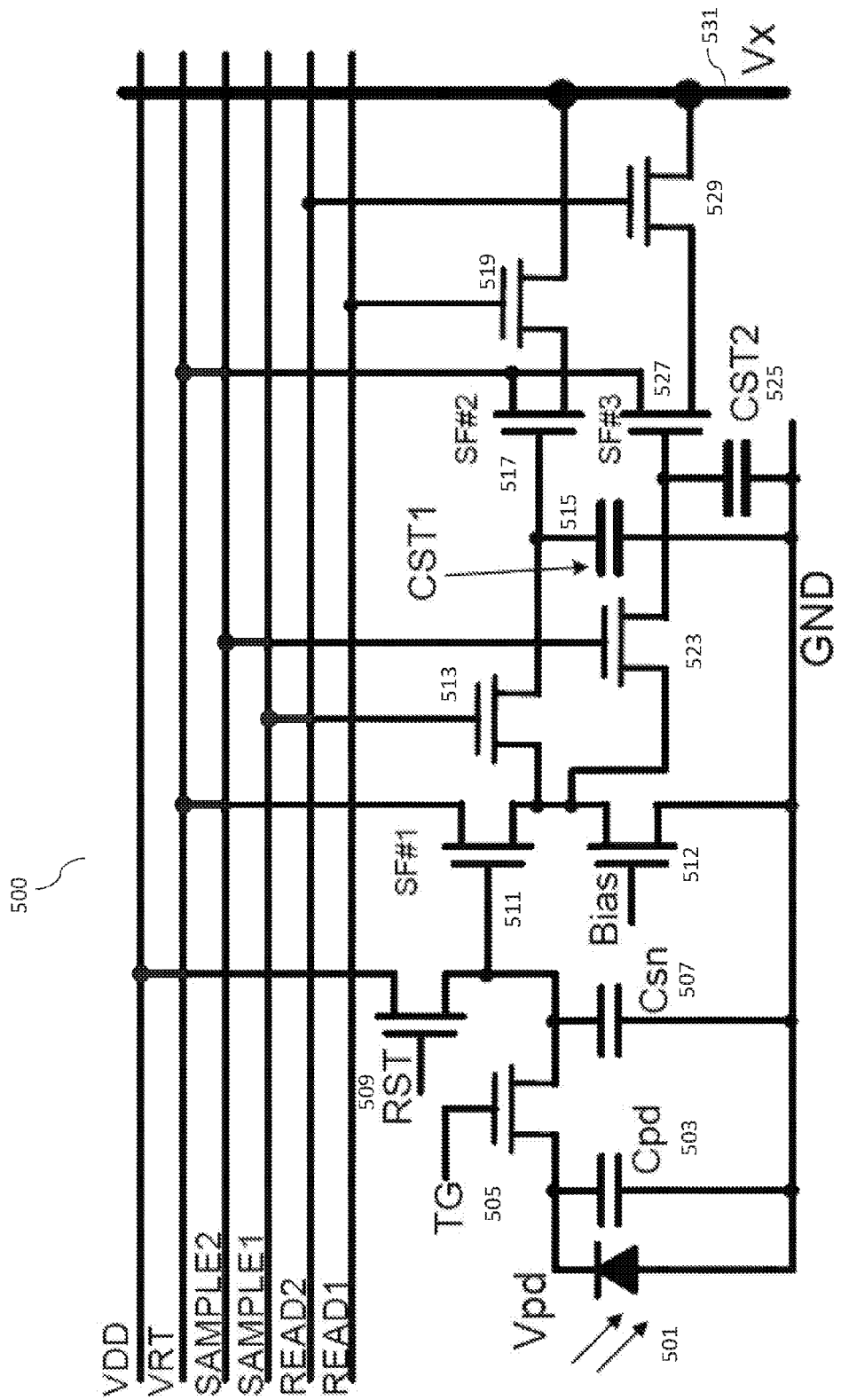
FIG. 5 shows an example two storage element voltage-domain global shutter pixel with single Vx line sensor arrangement.

With respect to FIGS. 4 and 5 example global shutter pixels with two storage elements are shown. A rolling blade shutter arrangement is one where pixels are processed line by line, one being reset and another being read out for each movement of the shutter. The selection of the reset row and readout row changes in sequence such that all the pixels are exposed for the same amount of time, but not all at the same time. A global shutter arrangement is one where all pixels are simultaneously released from reset and start to integrate simultaneously. After a specific period, all the pixels are then read out simultaneously into a temporary storage, which may be located inside the pixel. This temporary storage is then scanned out row by row where the signal is amplified or converted into a digital value. In the following examples the pixels are shown having a global shutter arrangement and furthermore a parallel arrangement of storage capacitors. However in some embodiments the pixels may have a rolling shutter arrangement or a series, or hybrid series-parallel arrangement of storage capacitors.

FIG. 4 schematically shows a global shutter pixel 400 which has two storage elements (capacitors) CST1 415 and CST2 425 per pixel. The pixel has a photodiode PD 401 which is sensitive to light. A transfer gate transistor 405 is provided. The transfer gate transistor 405 is controlled by a transfer gate signal TG. The drain of the transfer gate transistor 405 is coupled to a sense node capacitor Csn 407 whilst its source is coupled to the photo diode 401 (and its circuit modelled capacitor 403). A reset transistor 409 is provided which has its gate controlled by a reset signal RST.

The source is coupled to a voltage VDD and its drain is coupled to the sense node capacitor Csn 407. A diode source follower transistor SF#1 411 is provided with its gate coupled to the sense node capacitor Csn 407, its source coupled to a voltage VRT and its drain coupled to a bias transistor 412. The bias transistor 412 has its gate coupled to a bias voltage BIAS and its drain coupled to ground. A first switch is provided by a transistor 413 and a second switch is provided by a second transistor 423. The gate of the first switch transistor 413 is coupled to a SAMPLE1 control signal whilst the gate of the second switch transistor 423 is coupled to a SAMPLE2 control signal. The source of the first switch transistor 413 is coupled to the drain of the diode source follower transistor 411 and its drain is coupled to the first storage element capacitor CST1 415. The first storage element capacitor CST1 415 is further coupled to a gate of a second diode source follower transistor SF#2 417. The second diode source follower transistor SF#2 417 source is coupled to a voltage VRT and its drain coupled to a source of a first read transistor 419. The first read transistor 419 receives a READ signal at its gate to control the reading of the pixel. The drain of the first read transistor 419 provides the output voltage VxA to a first output line 431. The source of the second switch transistor 423 is coupled to the drain of the diode source follower transistor 411 and its drain is coupled to the second storage element capacitor CST2 425. The second storage element capacitor CST2 425 is further coupled to a gate of a third diode source follower transistor SF#3 427. The third diode source follower transistor SF#3 427 source is coupled to a voltage VRT and its drain coupled to a source of a second read transistor 429. The second read transistor 429 receives a READ signal at its gate to control the reading of the pixel. The drain of the second read transistor 429 provides the output voltage VxB to a second output line 433.

With reference to FIG. 5 a global shutter pixel 500 which has two storage elements (capacitors) CST1 515 and CST2 525 per pixel is shown. The difference between the pixel arrangements of FIG. 5 and FIG. 4 is that the pixel arrangement in FIG. 5 has only a single output line and as such cannot output the values in parallel. The pixel has a photodiode PD 501 which is sensitive to light. A transfer gate transistor 505 is provided. The transfer gate transistor 505 is controlled by a transfer gate signal TG. The drain of the transfer gate transistor 505 is coupled to a sense node capacitor Csn 507 whilst its source is coupled to the photo diode 501 (and its circuit modelled capacitor 503). A reset transistor 509 is provided which has its gate controlled by a reset signal RST. The source is coupled to a voltage VDD and its drain is coupled to the sense node capacitor Csn 507. A diode source follower transistor SF#1 511 is provided with its gate coupled to the sense node capacitor Csn 507, its source coupled to a voltage VRT and its drain coupled to a bias transistor 512. The bias transistor 512 has its gate coupled to a bias voltage BIAS and its drain coupled to ground. A first switch is provided by a transistor 513 and a second switch is provided by a second transistor 523. The gate of the first switch transistor 513 is coupled to a SAMPLE1 control signal whilst the gate of the second switch transistor 523 is coupled to a SAMPLE2 control signal. The source of the first switch transistor 513 is coupled to the drain of the diode source follower transistor 511 and its drain is coupled to the first storage element capacitor CST1 515. The first storage element capacitor CST1 515 is further coupled to a gate of a second diode source follower transistor SF#2 517. The second diode source follower transistor SF#2 517 source is coupled to a voltage VRT and its drain coupled to a source of a first read transistor 519. The first read transistor 519 receives a READ1 signal at its gate to control the reading of the pixel. The drain of the first read transistor 519 provides the output voltage Vx to an output line 531. The source of the second switch transistor 523 is coupled to the drain of the diode source follower transistor 511 and its drain is coupled to the second storage element capacitor CST2 525. The second storage element capacitor CST2 525 is further coupled to a gate of a third diode source follower transistor SF#3 527. The third diode source follower transistor SF#3 527 source is coupled to a voltage VRT and its drain coupled to a source of a second read transistor 529. The second read transistor 529 receives a READ2 signal at its gate to control the reading of the pixel. The drain of the second read transistor 429 provides the output voltage Vx to the output line 531.

The sensor shown in FIG. 1 thus has two independent storage elements in each pixel. In a monochrome sensor, these storage elements could be used to perform correlated double sampling (CDS) to cancel the "reset noise" aka "kTC noise" of the small (typically of the order of 1 fF) sense node capacitance Csn shown in FIGS. 4 and 5. For example, the sense node would be reset (which introduces kTC noise) and the corresponding voltage on the output from source follower transistor SF#1 (which includes the kTC component) would be stored on the sample capacitor CST1. Shortly afterwards, the transfer gate TG would be pulsed to transfer the photo-collected charge on the photodiode onto the sense node and the corresponding voltage on the output from source follower transistor SF#1 (which now includes the kTC noise component plus the signal component) would be stored on the sample capacitor CST2.

In some embodiments it may be possible however to utilize the storage elements such as shown in the above examples to store two separate exposures and thus speed up the capture phase of a multiple exposure image. In such embodiments the first storage element may be configured to store the image values for the first exposure (for example an exposure illuminated with a first bandlimited illumination source) and the second storage element may be configured to store the image values for the second exposure (for example an exposure illuminated with a second bandlimited illumination source). As the capture cycle speed using two storage elements is significantly faster than two capture cycles of a device using one storage element (or two storage elements of which one is used to store the reset noise value) then such an arrangement may be able to capture multiple exposures of the same image subject located at substantially the same location.

Figure 2:
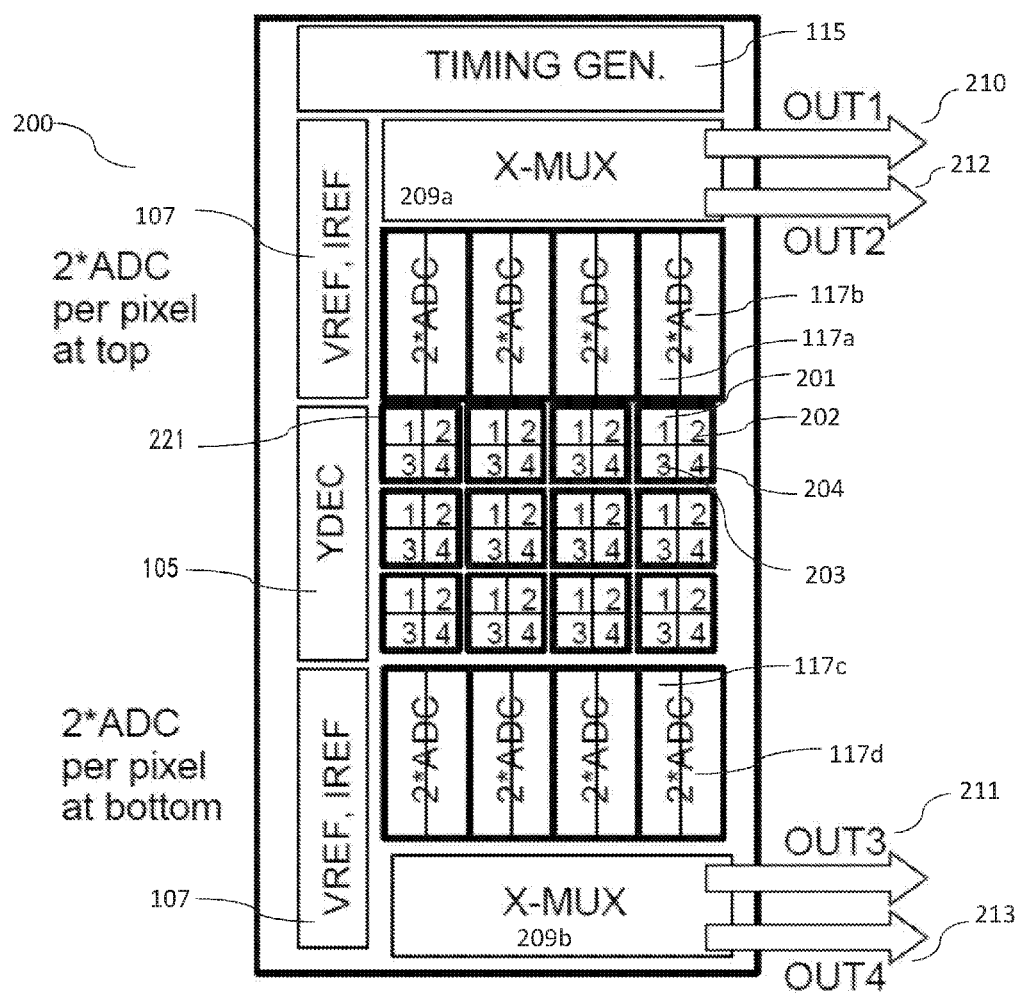
FIG. 2 shows an example four storage element sensor arrangement.

It is understood that in some embodiments the number of storage elements per pixel may differ from the two storage element example as shown in FIG. 1. For example FIG. 2 shows a four storage element pixel sensor arrangement. Similar to the dual-storage pixel such as shown in FIG. 1, it is possible to use these storage elements either to perform CDS on two images (resulting in no kTC noise) or to operate the pixel to store 4 image signals (e.g., when 4 LEDs, each of different emission wavelengths, are pulsed) without CDS and a higher noise content. Thus FIG. 2 shows an example four storage element sensor arrangement. The sensor 200 shows a global shutter sensor with an array of pixels 221, each pixel comprising 4 storage elements shown as storage element 1 201, storage element 2 202, storage element 3 203, and storage element 4 204. The output from each of the first and second storage elements 201, 202 of each pixel can for example be passed to a first 117a and second 117b analog to digital converter (ADC) located 'north' of the pixel array and the output from each of the third and fourth storage elements 203, 204 of each pixel can for example be passed to a third 117c and fourth 117d analog to digital converter (ADC) located south of the pixel array. The output of the 'north' ADC may be passed to a first column multiplexer (X-MUX) 209a which is configured to multiplex the outputs of the ADC 117 and provide them on a first and second output 210, 212 respectively. The output of the 'south' ADC may be passed to a second column multiplexer (X-MUX) 209b which is configured to multiplex the outputs of the ADC and provide them on a third and fourth output 211, 213 respectively.

The sensor may further comprise a voltage and current reference (VREF, IREF) generator 107 and furthermore a row decoder (YDEC) 105. The YDEC 105 can receive signals from the timing generator 115 to control the sampling period and read out from the pixels.

Shown in FIG. 1 and FIG. 2 is a block called "YDEC" or Y-Decoder. This YDEC block is typically comprised of a number of similar circuits one for each of the rows on the array. In an embodiment, the difference between each row is that the row is configured to respond only to a specific value on the YADDR bus. Each sub-block of YDEC receives control inputs, typically from the on-chip timing generator circuit 115 and also the YADDR bus and is configured to generate signals suitable for a single row of pixels. In some embodiments the sub-block comprises buffers (not shown) with adjustable slew-rate controls for some of the control signals.

Figure 3:
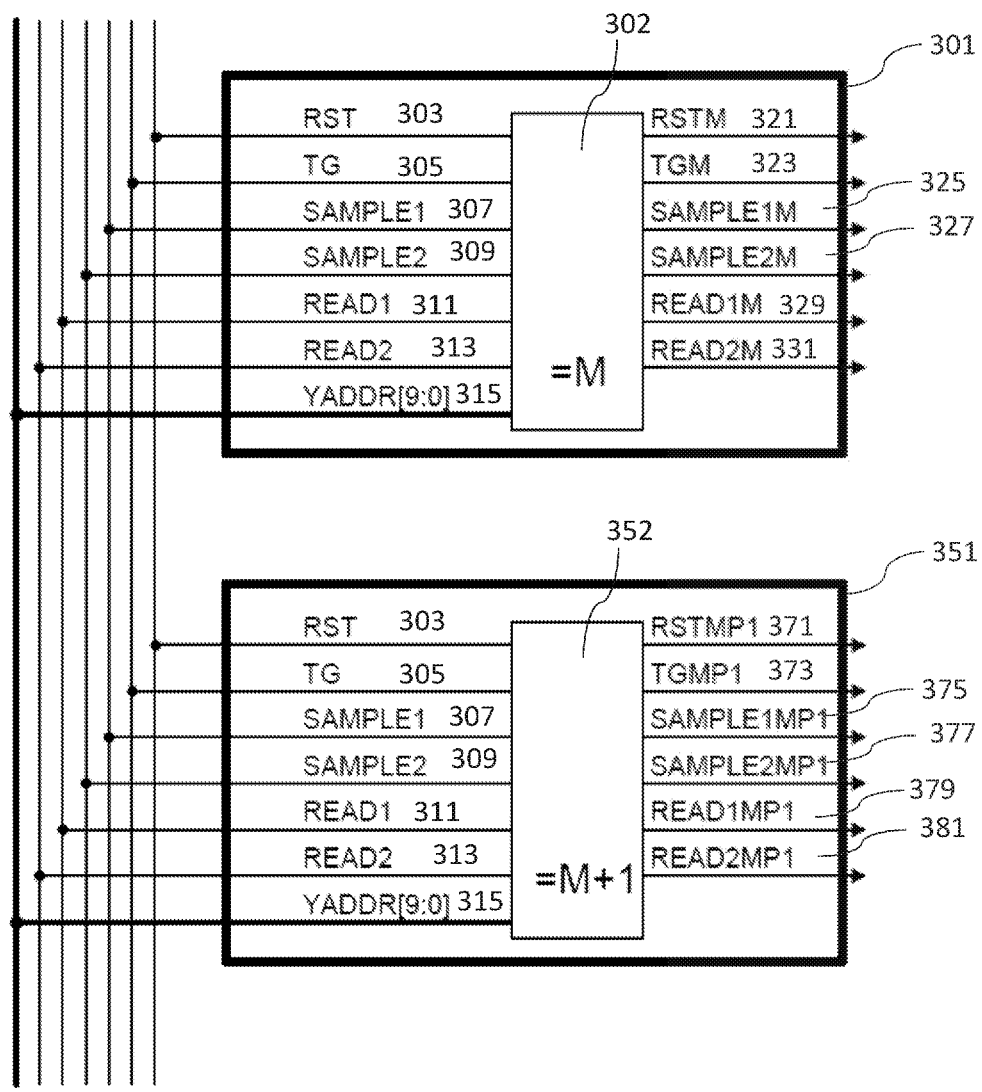
FIG. 3 shows an example Ydecoder block arrangement.

With respect to FIG. 3, an example part of an embodiment of a YDEC block is shown for generating signals for the M'th and M+1'th row. The M'th row signal generator 301 is configured to receive a RST signal input on line 303, a TG signal input on line 305, a first sample SAMPLE1 signal input on line 307, a second sample SAMPLE2 signal input on line 309, a first read READ1 signal input on line 311, a second read READ2 signal input on line 313, and a Y-address YADDR input signal on lines 315. The M'th row signal generator comprises circuitry 302 configured to generate suitable outputs based on the input signals and when the YADDR input signal address matches the value of M. The M'th row signal generator 301 can thus generate a RSTM signal on output line 321, a TGM signal on output line 323, a first sample SAMPLE1M signal on output line 325, a second sample SAMPLE2M signal on output line 327, a first read READ1M signal on output line 329, and a second read READ2M signal on output line 331.

The M+1'th row signal generator 351 is configured to receive a RST signal input on line 303, a TG signal input on line 305, a first sample SAMPLE1 signal input on line 307, a second sample SAMPLE2 signal input on line 309, a first read READ1 signal input on line 311, a second read READ2 signal input on line 313, and a Y-address YADDR input signal on lines 315. The M+1'th row signal generator 351 may comprise circuitry 352 which is configured to generate suitable outputs based on the input signals and when the YADDR input signal address matches the value of M+1. The M+1'th row signal generator 351 can thus generate a RSTMP1 signal on output line 371, a TGMP1 signal on output line 373, a first sample SAMPLE1MP1 signal on output line 375, a second sample SAMPLE2MP1 signal on output line 377, a first read READ1MP1 signal on output line 379, and a second read READ2MP1 signal on output line 381.

Thus in some embodiments some of the signals of every row will fire simultaneously on the array. For example, in global shutter mode, at the start of the photodiode reset sequence, it is necessary that all the RST and TG signals operate substantially simultaneously. Also, the SAMPLE1 signals operate substantially simultaneously over the whole array and similarly for SAMPLE2 which causes the appropriate voltage to be stored in CST1 and CST2 respectively.

Even in global shutter operation, the readout of each row may be done sequentially and this controlled by the YADDR [9:0] (for a sensor of less than 1025 rows) and the READ1 and READ2 signals. For example, when YADDR[9:0]=M and READ1 goes active, only the read signal READ1M (which is connected to the pixels on row #M) is activated and the read signal READ1MP1 (which is connected to the pixels on row #M+1) is not activated. Once the values on the pixels' storage capacitors of row #M has been read out (and in an embodiment, converted into a digital value by the ADC) the value on YADDR is incremented (binary or grey code) so that it matches "M+1" and when READ1 goes active, READ1MP1 is activated and READ1M remains. In some embodiments the row signal generator and its associated circuitry may be configured to control each row's VDD, VRT, BIAS analog reference signals.

In some embodiments the sensor may be configured to capture more than two image exposures using a two storage element per pixel sensor arrangement. In such embodiments the small pixel size of the two storage element arrangement is retained while being able to perform fast four exposure imaging.

Figure 6:
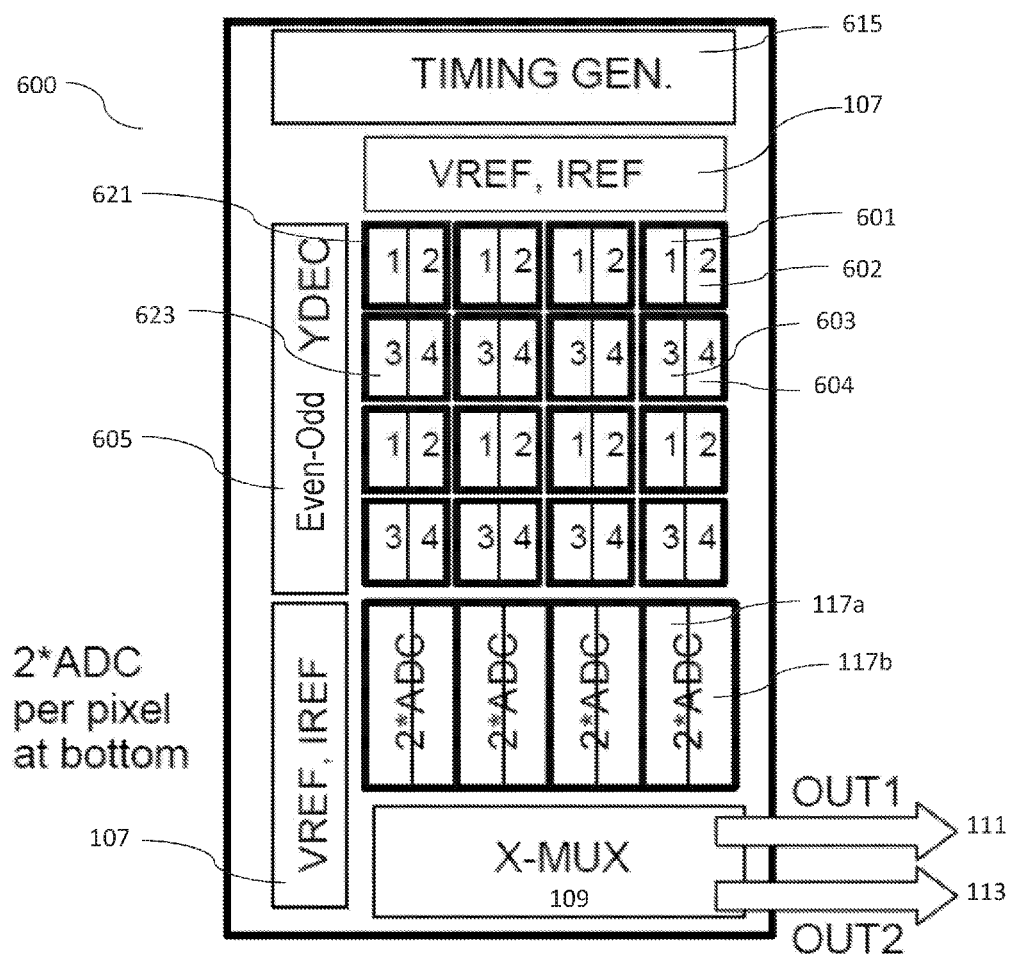
FIG. 6 shows an example quad exposure storage sensor arrangement according to some embodiments.

With respect to FIG. 6 an example two storage element sensor arrangement for four exposure imaging is shown. The sensor 600 shows a global shutter sensor with an array of pixels comprising odd rows 621 and even rows 623 of pixels. Each odd row 621 pixel comprises 2 storage elements shown as storage element 1 601, and storage element 2 602. Each even row 623 pixel comprises 2 storage elements shown as storage element 3 603, and storage element 4 604. The output from each storage element 601, 602, 603, 604 can for example be passed to an ADC block comprising 2 ADCs per pixel. Thus the ADC 117 shows a first 117a and second 117b analog to digital converter (ADC) associated with the last column of pixels. The output of the ADC 117 may be passed to a column multiplexer (X-MUX) 109 which is configured to multiplex the outputs of the ADC 117 and provide them on a first and second output 111, 113 respectively. The sensor may further comprise a voltage and current reference (VREF, IREF) generator 107 and furthermore an even-odd Ydecoder (YDEC) 605. The even-odd Ydecoder YDEC 605 can receive signals from the timing generator 615 to control the sampling period and read out from the pixels.

Figure 7:
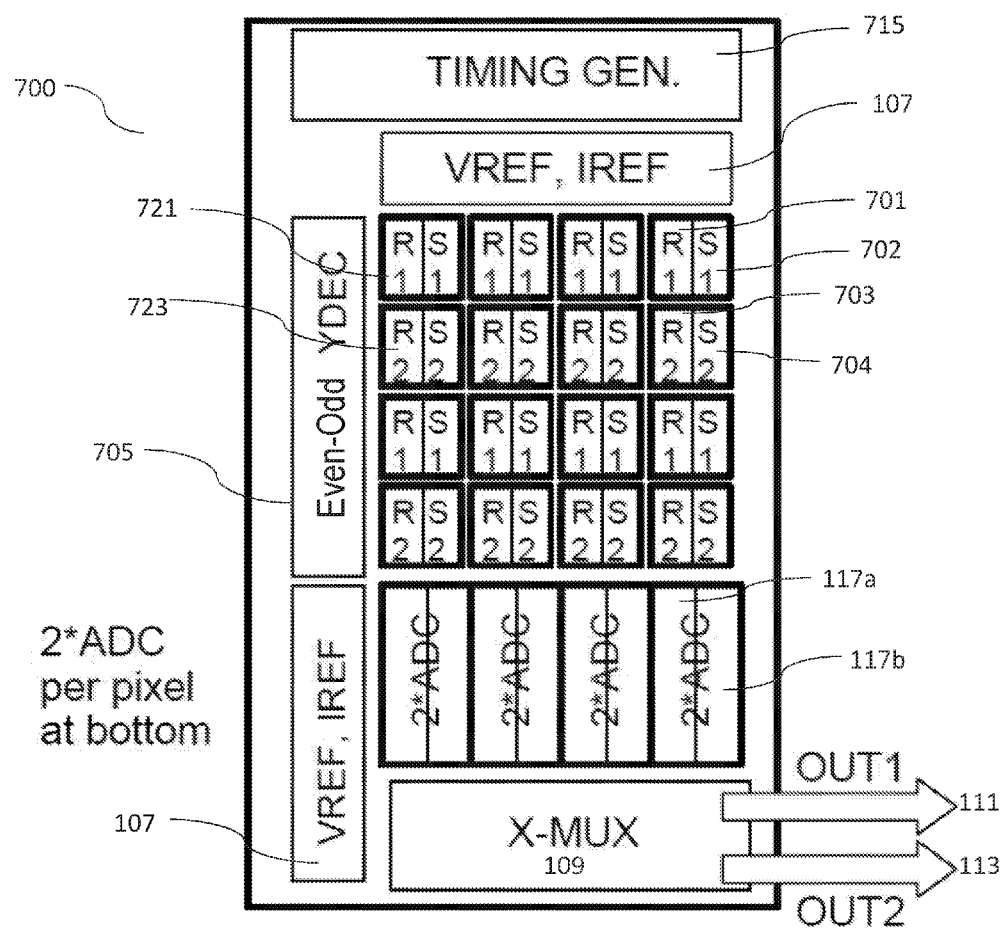
FIG. 7 shows an example two exposure-dual storage element sensor arrangement according to some embodiments.

Furthermore such a system may be configured to reset noise compensation. For example, FIG. 7 illustrates an example two storage element sensor arrangement for two exposure imaging with CDS shown. The sensor 700 shows a global shutter sensor with an array of pixels comprising odd rows 721 and even rows 723 of pixels. Each odd row 721 pixel comprises 2 storage elements shown as reset element 1 701, and storage element 1 702. Each even row 723 pixel comprises 2 storage elements shown as reset element 2 703, and storage element 2 704. The output from each reset element contains the CDS reset values and the storage element contains the image data. The reset and storage elements 701, 702, 703, 704 can for example be passed to an ADC block comprising 2 ADCs per pixel. Thus the ADC 117 shows a first 117a and second 117b analog to digital converter (ADC) associated with the last column of pixels. The output of the ADC 117 may be passed to a column multiplexer (X-MUX) 109 which is configured to multiplex the outputs of the ADC 117 and provide them on a first and second output 111, 113 respectively. The sensor may further comprise a voltage and current reference (VREF, IREF) generator 107 and furthermore an even-odd Ydecoder (YDEC) 705. The even-odd Ydecoder (YDEC) 705 can receive signals from the timing generator 715 to control the sampling period and read out from the pixels.

For example FIG. 6 enables the odd numbered rows to store illumination from LEDs #1 and #2 and the even numbered rows to store illumination from LEDs #3 & #4, whereas in the example shown in FIG. 7 enables the odd number rows to store a reset signal from frame #1 and illumination signal from LEDs #1 and the even numbered rows to store reset signal from frame #2 and illumination signal from LEDs #2. Note that the pixels employed by this technique shown in both FIG. 6 and FIG. 7 may be the same as shown in FIGS. 4 and 5. In these examples the rows alternate in order to split the rows into two parts with an approximately equal number of rows. However in some embodiments the rows may be split into any number of parts with any desired distribution of rows. For example the rows may be split into four parts of rows which follow the order part 1, part 2, part 3, and part 4 and then repeat (or other suitable ordering of rows). Or the rows may be split into a first part of the top half of rows and a second part of the bottom half of rows. In some embodiments the ordering of the division of the rows between the parts may not be a regular distribution (for example a first four rows may be split as part 1, part 2, part 3 and part 4 and the next four rows may be split as part 3, part 2, part 1, part 4.

However in some embodiments the pixels may be modified to include a 3rd storage element. In such embodiments the sensor may be configured to capture 6 exposures per cycle (for example to store 6 illumination signals). Furthermore in some embodiments the pixels may be modified to include 4 storage elements. In such embodiments the sensor may be configured to capture 8 exposures per cycle (for example store 8 illumination signals without CDS) or capture 4 exposures (illumination signals) and 4 reset signals and so enable CDS. For example odd numbered rows of pixels may store reset and illumination signals from the first and second exposure and the even numbered rows of pixels may store reset and illumination signals from the third and fourth exposures.

An embodiment facilitates moving the complexity and flexibility of operation from the pixel where size is critical (and thus cost is critical) and towards the Y-decoder for each row. As the Y-Decoder circuitry controls pixels on a row by row basis then this is more efficient than adding circuitry to every pixel.

Figure 8:
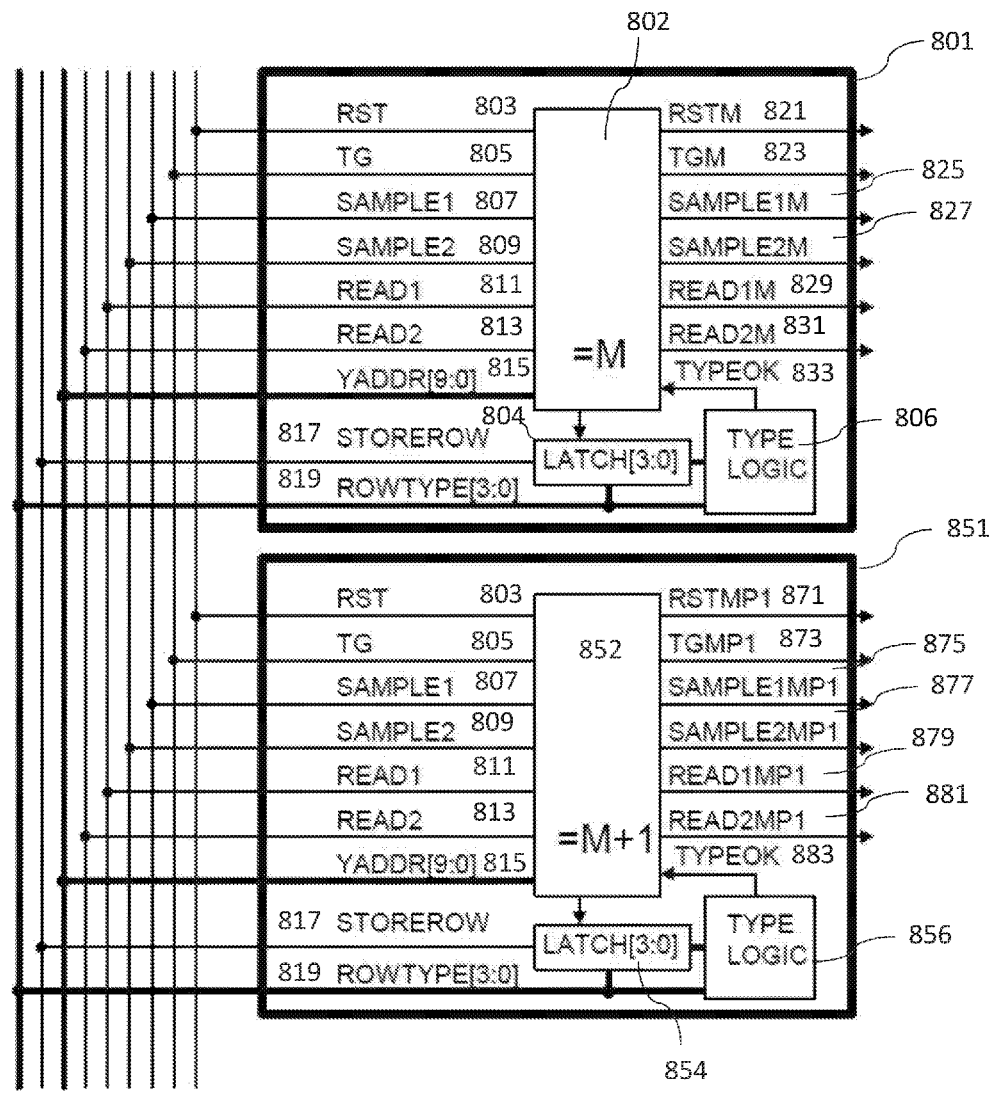
FIG. 8 shows an example Ydecoder block arrangement according to some embodiments.

With respect to FIG. 8, an example part of an even-odd YDEC block 605, 705 is shown for generating signals for the M'th and M+1'th row. The M'th row signal generator 801 is configured to receive a RST signal on input line 803, a TG signal on input line 805, a first sample SAMPLE1 signal on input line 807, a second sample SAMPLE2 signal on input line 809, a first read READ1 signal on input line 811, a second read READ2 signal on input line 813, Y-address YADDR input signal on lines 815, a STOREROW input signal on line 817 and row-type ROWTYPE input signal on lines 819. The M'th row signal generator comprises circuitry 802 which in operation generates suitable outputs based on the input signals and when the YADDR input signal address matches the value of M. Furthermore the circuitry 802 is configured to receive an ok signal from a row-type logic circuit 806 configured to check the row-type value input via a latch 804, which is further configured to receive the row-type signal and store-row signal inputs. The M'th row signal generator 801 can thus generate a RSTM signal on output line 821, a TGM signal on output line 823, a first sample SAMPLE1M signal on output line 825, a second sample SAMPLE2M signal on output line 827, a first read READ1M signal on output line 829, and a second read READ2M signal on output line 831.

The M+1'th row signal generator 851 is configured to receive a RST signal input on line 803, a TG signal input on line 805, a first sample SAMPLE1 signal input on line 807, a second sample SAMPLE2 signal input on line 809, a first read READ1 signal input on line 811, a second read READ2 signal input on line 813, Y-address YADDR input signal on lines 815, a STOREROW input signal on line 817 and row-type ROWTYPE input signal on lines 819. The M+1'th row signal generator 851 may comprise circuitry 852 which is configured to generate suitable outputs based on the input signals and when the YADDR input signal address matches the value of M+1. Furthermore the circuitry 852 is configured to receive an ok signal from a row-type logic circuit 856 configured to check the row-type value input via a latch 854, which is configured to receive the row-type signal and store-row signal inputs. The M+1'th row signal generator 851 can thus generate a RSTMP1 signal on output line 871, a TGMP1 signal on output line 873, a first sample SAMPLE1MP1 signal on output line 875, a second sample SAMPLE2MP1 signal on output line 877, a first read READ1MP1 signal on output line 879, and a second read READ2MP1 signal on output line 881. In other words an output XXXM from the YDEC goes to the signal line XXX on pixel row M (for example RSTM represents a reset signal line output for pixel M). Similarly an output XXXMPY from the YDEC goes to the signal line XXX on pixel line M+Y (for example RSTM+1 represents a reset signal line output for pixel M+1).

In some embodiments the latch 804, 854 is written to when the Y address (YADDR[9:0]) matches the value for a particular row and the store row (STOREROW) input signal is enabled. In some embodiments the address decoder such as described herein with respect to the YDEC shown in FIG. 3 is employed to determine whether the Y address value matches the particular row value. In some embodiments the output from the latch 804, 854 is coupled to the row-type logic circuit "TYPE LOGIC" 806, 856 along with the input from the row-type (ROWTYPE[3:0]) bus signals. When the latch (LATCH[3:0]) or row-type (ROWTYPE[3:0]) values match, the row-type logic circuit 806, 856 is configured to generate a valid "TYPEOK" output which can be received by the circuitry 802, 852 to enable the control signals output.

In some embodiments if the row-type input value (ROWTYPE[3:0]) is at a determined value, which may be predetermined, all of the Y decoder circuitry (YDECODER sub-blocks) 802, 852 may be enabled. This for example can be useful when it is desired to switch from a mode where only some rows are enabled in a global shutter mode to a mode where all the rows are enabled in global shutter mode.

An example reset output signal truth table is shown hereafter for row #M and #M+1. It is understood that similar logic functions may be applied for the other signals TG, SAMPLE1, SAMPLE2, READ1, READ2 and also if controlled by the Y-decoder (YDECODER) BIAS, VRT, VDD. In the following example the latch value (LATCH[3:0]) of row #M has been previously set to a value of 1 and the latch value (LATCH[3:0]) of row #M+1 has been previously set to a value of 2.

| RST | ROWTYPE [3:0] | LATCH [3:0] (Row #M) | TYPEOK (Row #M) | RSTM |
|---|---|---|---|---|
| 1 | 0 | 0-15 | 1 | 1 |
| 0 | 0 | 0-15 | 1 | 0 |
| 1 | 1 | 1 | 1 | 1 |
| 0 | 1 | 1 | 1 | 0 |
| X | 2-15 | 1 | 0 | 0 |

| RST | ROWTYPE [3:0] | LATCH [3:0] (Row #M + 1) | TYPEOK (Row #M + 1) | RSTMP1 |
|---|---|---|---|---|
| 1 | 0 | 0-15 | 1 | 1 |
| 0 | 0 | 0-15 | 1 | 0 |
| 1 | 1 | 2 | 0 | 0 |
| 1 | 2 | 2 | 1 | 1 |
| 0 | 2 | 2 | 1 | 0 |
| X | 3-15 | 2 | 0 | 0 |

In these examples a defined reserved value of 0 on the row-type (ROWTYPE) input may be reserved to enable all the Y decoder circuitry (YDecoder sub-blocks) and other values of row type (ROWTYPE) match the value written to and stored in the latch. In some embodiments adding additional logic to the row-type logic circuit ("TYPELOGIC" circuitry), whereby certain rows match certain values defined during manufacture and not during operation in other words the row decoding is hardwired. For example

| ROWTYPE[3:0] | Action |
|---|---|
| 0 | All rows are activated |
| 1-7 | Only rows where ROWTYPE[3:0] = LATCH[3:0] are activated |
| 8 | Even number rows are activated |
| 9 | Odd number rows are activated |
| 10 | Rows at the top half of the array are activated |
| 11 | Rows at the bottom half of the array are activated |
| 12 | Rows where MOD(YADDR, 4) = 0 are activated |
| 13 | Rows where MOD(YADDR, 4) = 1 are activated |
| 14 | Rows where MOD(YADDR, 4) = 2 are activated |
| 15 | Rows where MOD(YADDR, 4) = 3 are activated |

Thus in the example above the row type value of 0 may be used to control the activation of all of the rows, a value of 1 to 7 used to control that the row is active when it matches the latch value, a value of 8 used to control that the row is active when it matches an even value, a value of 9 used to control that the row is active when it matches an odd value, a value of 10 used to control that the row is active when it matches a value within the top half of the array, a value of 11 used to control that the row is active when it matches a value within the bottom half of the array, a value of 12 used to control that the row is active when it is completely divisible by 4, a value of 13 used to control that the row is active when it has a remainder of 1 when divided by 4, a value of 14 used to control that the row is active when it has a remainder of 2 when divided by 4, and a value of 15 used to control that the row is active when it has a remainder of 3 when divided by 4. In other words splitting the array into odd and even rows using values 8 and 9, splitting the array into top and bottom parts using values 10 and 11, and splitting the array into 4 using values 12 to 15.

In an embodiment, it is possible to activate various patterns of rows by changing the value on the ROWTYPE bus. This can be done quickly (for example 10 ns), which enables the acquisition of several sub-frames of images to be performed quickly.

An embodiment may employ an initialization phase (which may occur on power up, when the system needs to be re-configured, on a periodic basis to correct for any "glitches" in the LATCH in each Ydecoder, etc.). The initialization phase may comprise placing a row-type value on the ROWTYPE[3:0] bus. The value of appropriate rows may furthermore be placed sequentially on the bus YADDR [9:0] and the store-row signal (STOREROW) may be pulsed for each value on the YADDR bus.

For example if the array is to split into alternating rows and odd numbered rows are to be assigned ROWTYPE#1 and even numbered rows are to be assigned ROWTYPE#2, then the initialization operations may comprise:

Deactivate RST, TG, SAMPLE1, SAMPLE2, READ1, READ2
Set ROWTYPE:=1
FOR YADDR:=1 to MAX(Y-1) STEP 2
  Pulse STOREROW
NEXT YADDR
ROWTYPE:=2
FOR YADDR:=0 to MAX(Y) STEP 2
  Pulse STOREROW
NEXT YADDR These operations may set the latch value (LATCH[3:0]) for each row before the images are captured.

Having defined the latch values for each Y-decoder then to enable the sensor to acquire 4 images (each image a global shutter image) using the sensor shown in FIG. 6 (the four storage with dual storage element pixels), then the following sequence of operations may be performed SET ROWTYPE=1
Perform exposure #12
SET ROWTYPE=2
Perform exposure #34
SET ROWTYPE=0 {or other determined "reserved value")
Readout Array In some embodiments the operations summarized by the operation "Perform exposure #12" may comprise:
SET RST ON
SET TG ON
SET TG OFF # Photodiode is now reset, BUT as ROWTYPE=1 then only odd # rows are reset
Turn on LED wavelength #1
Turn off LED wavelength #1
SET RST OFF
SET BIAS On
SET TG On
SET Sample1 ON # Store exposure #1 in CST1 of odd # rows
SET Sample1 OFF
SET RST ON
SET TG ON
SET TG OFF # Photodiode is now reset, BUT as ROWTYPE=1 then only odd # rows are reset
Turn on LED wavelength #2
Turn off LED wavelength #2
SET BIAS On
SET TG On
SET Sample2 ON # Store exposure #2 in CST2 of odd # rows
SET Sample2 OFF #
and the operations summarized by the operation "Perform exposure #34" may comprise:
SET RST ON
SET TG ON SET TG OFF # Photodiode is now reset, BUT as
   ROWTYPE=2 then only even
   # rows are reset
Turn on LED wavelength #3
Turn off LED wavelength #3
SET RST OFF
SET BIAS On
SET TG On
SET Sample1 ON # Store exposure #3 in CST1 of even
   # rows
SET Sample1 OFF
SET RST ON
SET TG ON
SET TG OFF # Photodiode is now reset, BUT as
   ROWTYPE=2 then only even
   # rows are reset
Turn on LED wavelength #4
Turn off LED wavelength #4
SET BIAS On
SET TG On
SET Sample2 ON # Store exposure #4 in CST2 of even
   # rows
SET Sample2 OFF and the operations as summarized by the operation "ReadoutArray" may comprise:
   FOR YADDR:=0 to MAXY # STEP 1=read all the rows
   Pulse READ1, READ2 # In parallel if two ADCs per
      column or in sequence # if single
      ADC per column
   NEXT YADDR Note that during this operation the row-type (ROWTYPE) may be set to the "reserved value" (for example SET ROWTYPE:=0) which may cause the logic in each column to ignore the value stored in the latch (LATCH[3:0]) and the type row check determines the "TYPEOK" value is TRUE. The READ1X and READ2X signals may then be activated for each row as determined by the value on the Y address (YADDR) bus.

An advantage of an embodiment of these operations or similar is that the time for each exposure and store (sample on CST capacitors) which may be 10 µs (minimum and may be longer if longer exposure/LED pulse is required). Thus the whole sequence is performed in 40 µs (a time period which is independent of the size of the pixel array) in which all of the exposures have been acquired plus a readout period of 10 ms. This may be compared to previous systems which may take 10 ms to readout an array and so 40 ms to acquire 4 exposures. During a 40 ms period the object or sensor may have moved, making image reconstruction orders of magnitude more difficult.

In a similar manner a CDS mode of operation such as shown in the example FIG. 7 can be implemented. Thus having defined the latch values for each Y-decoder, to enable the sensor to acquire 2 images (each image a global shutter image with a reference dark value stored for each pixel to enable CDS), then the following sequence of operations may be performed
   SET ROWTYPE=1
   Perform exposure #1
   SET ROWTYPE=2
   Perform exposure #2
   SET ROWTYPE=0 {or other determined "reserved value")
   Readout Array Where the operations summarized by the operation "Perform exposure #1" may comprise:
   SET RST ON
   SET TG ON
   SET TG OFF # Photodiode is now reset, BUT as
      ROWTYPE=1 then only odd # rows are reset
   Turn on LED wavelength #1
   Turn off LED wavelength #1
   SET BIAS On
   SET RST OFF
   SET Sample1 ON
   SET Sample1 OFF
   SET TG ON # Store reset #1 in CST1 of odd # rows
   SET Sample2 ON
   SET Sample2 OFF
   SET BIAS OFF
   SET TG OFF # Store image signal #1 in CST2 of odd # rows the operations summarized by the operation "Perform exposure #2" may comprise
   SET RST ON
   SET TG ON
   SET TG OFF # Photodiode is now reset, BUT as
      ROWTYPE=2 then only even # rows are reset
   Turn on LED wavelength #2
   Turn off LED wavelength #2
   SET BIAS On
   SET RST OFF
   SET Sample1 ON
   SET Sample1 OFF
   SET TG ON # Store reset #2 in CST1 of even # rows
   SET Sample2 ON
   SET Sample2 OFF
   SET BIAS OFF
   SET TG OFF # Store image signal #2 in CST2 of even # rows and the operations summarized by the operation "ReadoutArray" may comprise
   FOR YADDR:=0 to MAXY # STEP 1=read all the rows
   Pulse READ1, READ2 # In parallel if two ADCs per
      column or in sequence # if single
      ADC per column
   NEXT YADDR In a similar manner to the previous example during this operation the row type (ROWTYPE) value may be set to the "reserved value" (e.g., "0") which will cause the logic in each column to ignore the value stored in the latch (LATCH [3:0]) and the value "TYPEOK" is set to TRUE. The READ1X and READ2X signals may then be activated for each row as determined by the value on the Y-address (YADDR) bus.

In the examples shown the Y-decoder is configured to divide the rows such that the rows are interleaved or divided into the various segments or parts. This row division or interleaving enables the sensor array to capture a number of exposures equal to the number of storage elements and furthermore enable CDS to be performed or to capture a number of exposures greater than the number of storage elements. However in some embodiments it may be desired to enable both row and column division or segmentation. For example in order to enable more accurate spatial sampling similar spatial sampling frequencies in both horizontal and vertical directions may be desired. The examples disclosed previously reduced the vertical spatial sampling frequency, but did not change the horizontal spatial sampling frequency.

Figure 9:
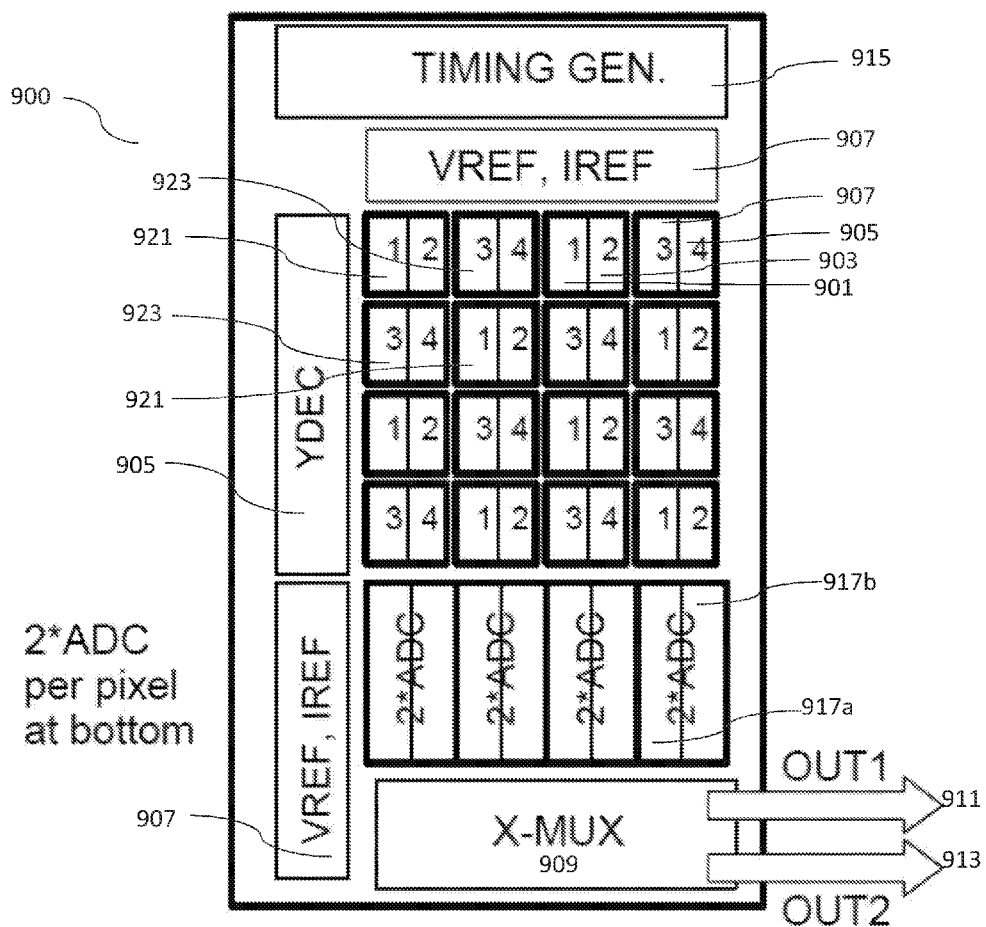
FIG. 9 shows a dual exposure-dual storage element with interleaving sensor arrangement according to some embodiments.

With respect to FIG. 9 an example two storage element sensor arrangement for four exposure imaging with both horizontal and vertical interleaving is shown. The sensor 900 shows a global shutter sensor with an array of pixels comprising odd rows which comprise alternating arrangements pixel segments starting with a first segment pixel 921 and followed by a second segment pixel 923 and repeating till the end of the row. Furthermore the array comprises even rows comprising alternating arrangements pixel segments starting with a second segment pixel 923 and followed by a first segment pixel 921 and repeating until the end of the row. The rows are thus arranged such that in each column there is furthermore an alternating pattern of first segment pixel 921 and followed by a second segment pixel 923 until the end of the column or an alternating pattern of second segment pixel 923 and followed by a first segment pixel 921 until the end of the column depending on if the column is an odd or even numbered column.

In such an arrangement a first segment pixel 921 (or an 'a' pixel) comprises 2 storage elements shown as storage element 1 901, and storage element 2 903. Each second segment pixel 923 (or 'b' pixel) comprises 2 storage elements shown as storage element 3 905, and storage element 4 907. The output from each storage element 901, 903, 905, 907 can for example be passed to an ADC block comprising 2 ADCs per pixel. Thus the ADC 917 shows a first 917a and second 917b analog to digital converter (ADC) associated with the last column of pixels. The output of the ADC 917 may be passed to a column multiplexer (X-MUX) 909 which is configured to multiplex the outputs of the ADC 917 and provide them on a first and second output 911, 913 respectively. The sensor may further comprise a voltage and current reference (VREF, IREF) generator 907 and furthermore a Y-decoder (YDEC) 905. The Y-decoder 905 can receive signals from the timing generator 915 to control the sampling period and read out from the pixels.

Figure 10:
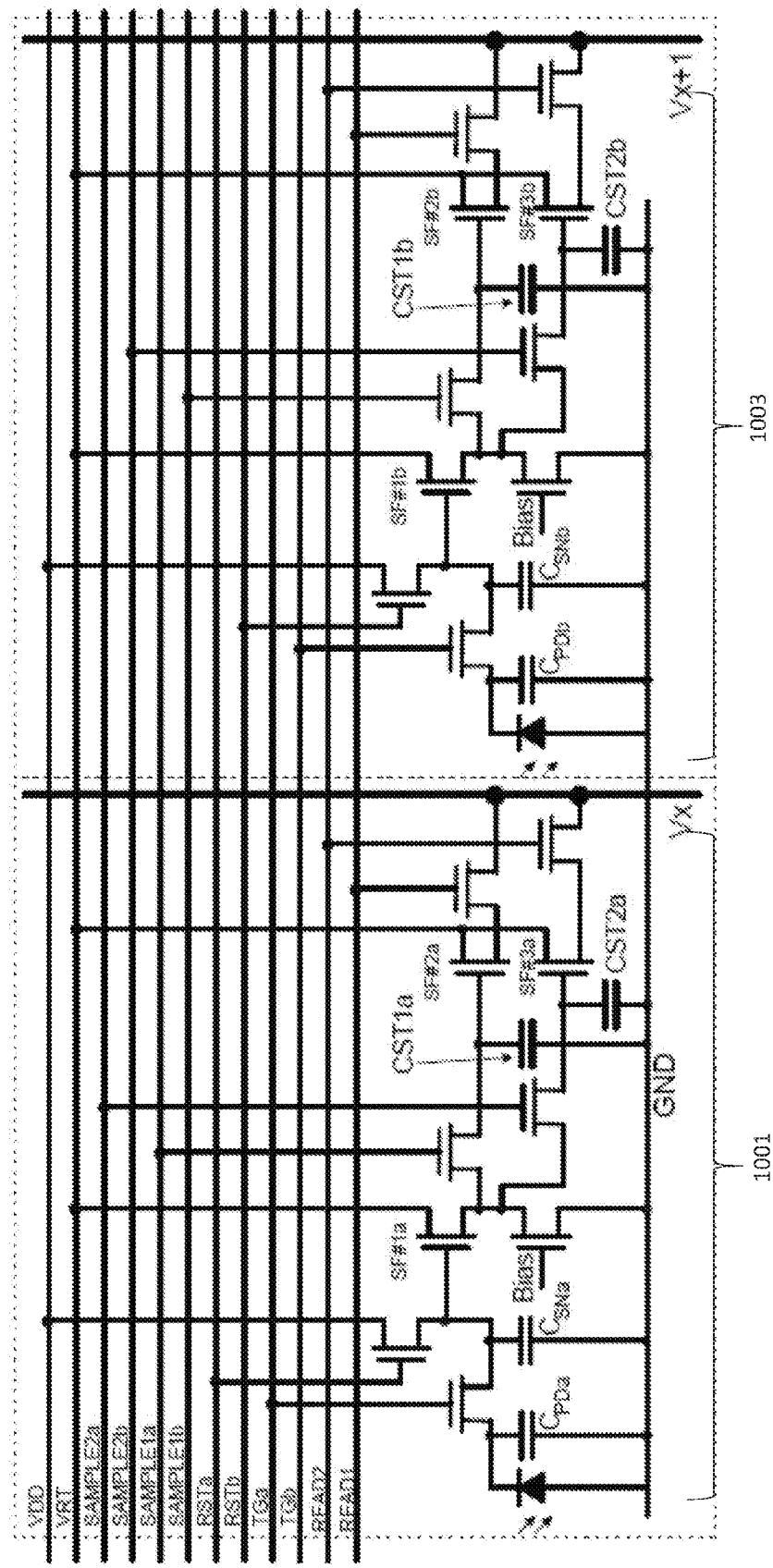
FIG. 10 shows an interleaving pixel arrangement suitable for the dual exposure-dual storage element with interleaving sensor arrangement as shown in FIG. 9.

FIG. 9 thus shows a sensor arrangement which uses dual-in pixel storage and is able to store 4 exposure values (or 2 exposure values and 2 reset values) and has similar horizontal and vertical sampling frequencies by the addition of horizontal interleaving to the vertical interleaving previously disclosed. In order to implement horizontal interleaving, the pixel wiring may employ more control signals. An example of which may be shown in FIG. 10. FIG. 10 for example shows that in order to enable horizontal interleaving signals such as Sample1, Sample2, RST, TG are doubled such that an 'a' pixel 1001 comprising the CST1a and CST2a storage elements is configured to receive Sample1a, Sample2a, RSTa, and TGa signals as well as a VDD, VRT and Read1 and Read2 signals. Furthermore as shown in FIG. 10 the 'b' pixel 1003 comprising the CST1b and CST2b storage elements is configured to receive Sample1b, Sample2b, RSTb, and TGb signals as well as the as well as a VDD, VRT and Read1 and Read2 signals. In some embodiments the BIAS, and VRT may also be "doubled" (in other words have BIASa and BIASb also VRTa and VRTb signals).

Figure 11:
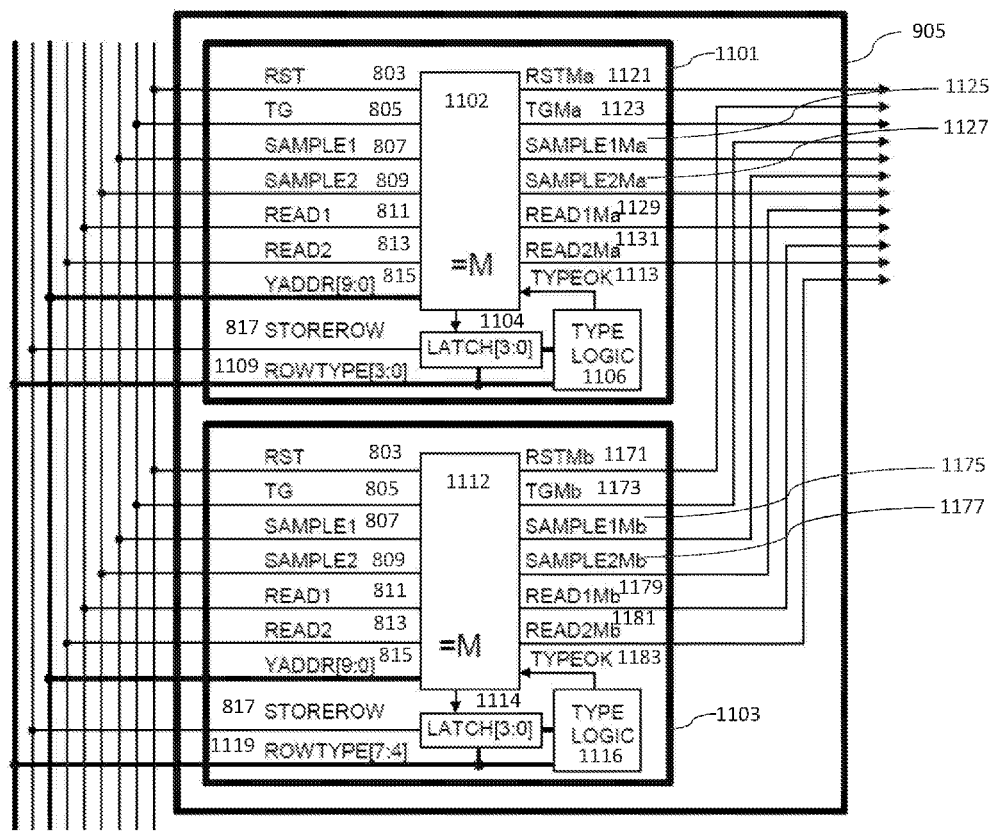
FIG. 11 shows an example Ydecoder block arrangement suitable for the dual exposure-dual storage element with interleaving sensor arrangement as shown in FIG. 9.

Furthermore the Y-Decoder 905 may comprise circuitry for controlling the 'a' and 'b' segment pixels. For example FIG. 11 shows a single row part of the Y-decoder 905 for controlling a row #M. The M'th row signal generator comprises a first part 1101 configured to receive a RST signal input on line 803, a TG signal input on line 805, a first sample SAMPLE1 signal input on line 807, a second sample SAMPLE2 signal input on line 809, a first read READ1 signal input on line 811, a second read READ2 signal input on line 813, Y-address YADDR input signal on lines 815, a STOREROW input signal on line 817 and first part of a row-type (ROWTYPE(3:0)) input signal on lines 1109. The first part 1101 comprises circuitry 1102 which can then generate suitable outputs based on the input signals and when the YADDR input signal address matches the value of M. Furthermore the circuitry 1102 is configured to receive an ok signal 1133 from a row-type logic circuit 1106 configured to check the first part of the row-type value input via a latch 1104, which is further configured to receive the first part of the row-type signal and store-row signal inputs. The first part of the M'th row signal generator 1101 can thus generate a RSTMa signal on output line 1121, a TGMa signal on output line 1123, a first sample SAMPLE1Ma signal on output line 1125, a second sample SAMPLE2Ma signal on output line 1127, a first read READ1Ma signal on output line 1129, and a second read READ2Ma signal on output line 1131.

The M'th row signal generator comprises a second part 1103 configured to receive a RST signal input on line 803, a TG signal input on line 805, a first sample SAMPLE1 signal input on line 807, a second sample SAMPLE2 signal input on line 809, a first read READ1 signal input on line 811, a second read READ2 signal input on line 813, Y-address YADDR input signal on lines 815, a STOREROW input signal on line 817 and second part of a row-type (ROWTYPE(7:4)) input signal on lines 1119. The second part 1103 comprises circuitry 1112 which in operation generates suitable outputs based on the input signals and when the YADDR input signal address matches the value of M. Furthermore the circuitry 1112 is configured to receive an ok signal 1183 from a row-type logic circuit 1116 configured to check the second part of the row-type value input via a latch 1114, which is further configured to receive the second part of the row-type signal and store-row signal inputs. The second part of the M'th row signal generator 1103 can thus generate a RSTMb signal on output line 1171, a TGMb signal on output line 1173, a first sample SAMPLE1 Mb signal on output line 1175, a second sample SAMPLE2 Mb signal on output line 1177, a first read READ1 Mb signal on output line 1179, and a second read READ2 Mb signal on output line 1181. Thus the two sub-blocks drive the signals for the "a" pixels (e.g., odd numbered columns) and "b" pixels (e.g., even numbered columns). Furthermore the row-type (ROWTYPE) bus is doubled in width (now 8 bits) compared to the non-interleaved rows in order to allow independent control of each of the sub-blocks for each row.

In some embodiments the latch 1104, 1114 is written to when the Y address (YADDR[9:0]) matches the value for a particular row and the store row (STOREROW) input signal is enabled. In some embodiments the address decoder such as described herein with respect to the YDEC shown in FIG. 3 is employed to determine whether the Y address value matches the particular row value. In some embodiments the output from the latch 1104 is coupled to the row-type logic circuit "TYPE LOGIC" 1106 along with the input from the row-type (ROWTYPE[3:0]) bus signals. In some embodiments the output from the latch 1114 is coupled to the row-type logic circuit "TYPE LOGIC" 1116 along with the input from the row-type (ROWTYPE[7:4]) bus signals. When the latch or row-type values match, the row-type logic circuit 1106, 1116 is configured to generate a valid "TYPEOK" output which can be received by the circuitry 1102, 1112 to enable the control signals output.

In some embodiments if the row-type input value is at a determined value, which may be predetermined, all of the Y decoder circuitry (YDECODER sub-blocks) 1102, 1112 may be enabled. This for example can be useful when it is desired to switch from a mode where only some rows are enabled in a global shutter mode to a mode where all the rows are enabled in global shutter mode.

Figure 12:
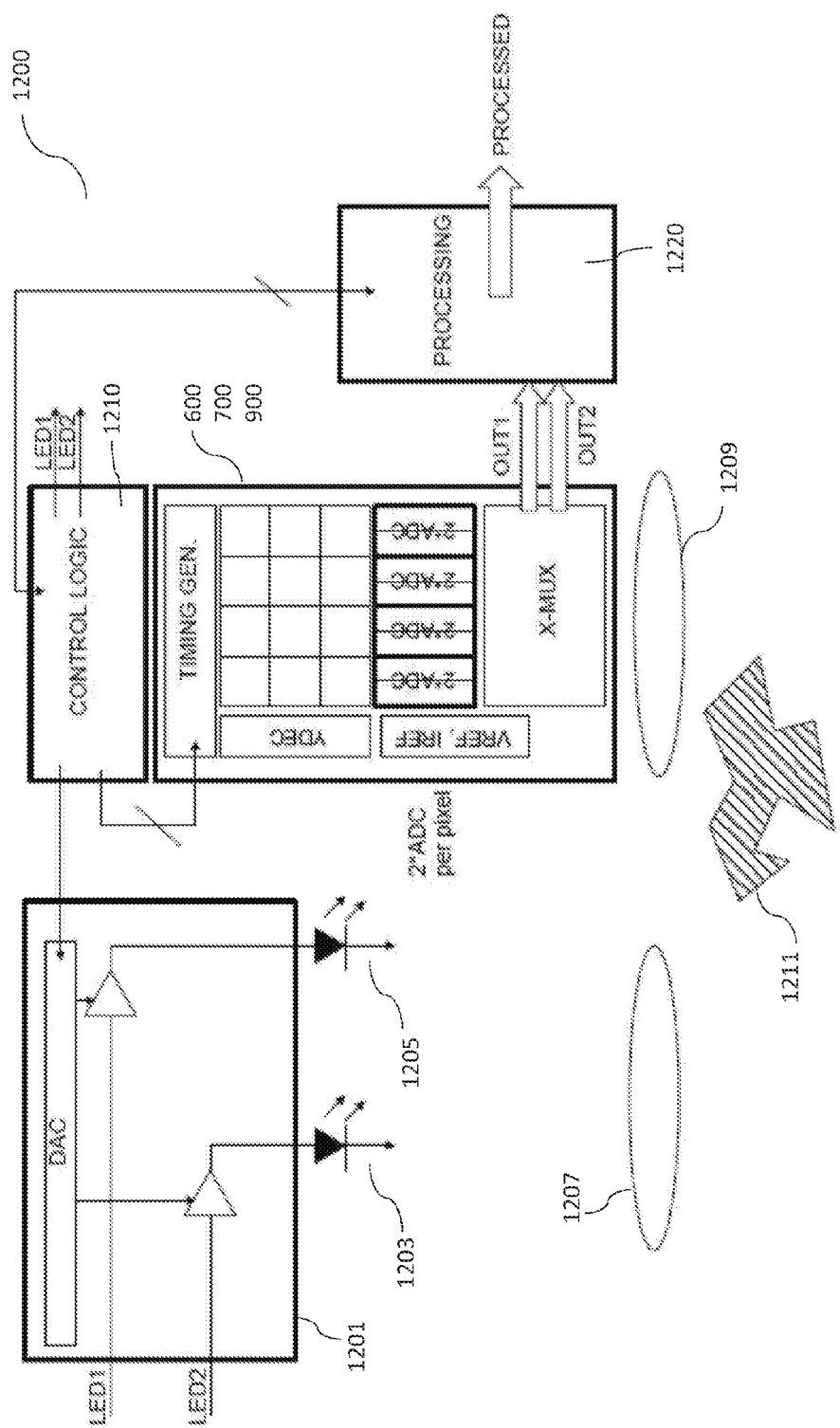
FIG. 12 shows an example 2 LED-Global shutter pixel system according to some embodiments.

With respect to FIG. 12 an implementation of an imaging sensor system 1200 comprising a sensor arrangement such as, for example, the arrangements shown in FIGS. 6, 7 or 9 is shown. The imaging sensor system as shown in FIG. 12 is a 2 LED with global shutter pixels with 2 outputs per pixel and a narrow ADC. In some embodiments a narrow ADC has a width which is <=½ the pixel pitch. In such embodiments two ADCs can fit in the width of a pixel. The imaging sensor system 1200 may comprise control logic circuitry 1210 for controlling the image capture and processing. The control logic circuitry 1210 may thus be coupled to the sensor arrangement 600, 700, 900 and be configured to control the timing generator within the sensor arrangement 600, 700, 900. The control logic circuitry 1210 may furthermore be configured to generate control signals for a first LED (LED1) and a second LED (LED2) and to a light illumination source driver 1201. The control logic circuitry 1210 may also be coupled to a processor 1220.

The imaging sensor system 1200 comprises a light illumination source driver 1201 which in the example shown in FIG. 12 comprises a digital to analog converter (DAC) which is coupled to a first LED power source controllably powering a first LED 1203 and also coupled to a second LED power source controllably powering a second LED 1205.

The sensor arrangement 600, 700, 900 may be configured to output the illumination values to the processor 1220. The processor 1220 may for example be configured to combine the image values.

Thus for example the two LED have different wavelength. The LEDs may emit light in the visible range (400 nm to 650 nm) or in near IR (650 nm-1000 nm) or near UV (200 nm-400 nm). In some embodiments the brightness of the LEDs when they are on are adjustable. For example in FIG. 12, the brightness of the LEDs may be controlled by a signal (voltage or current) output from a DAC and in an embodiment the brightness of each LED is independently controlled. In some embodiments the two, independent control signals enable the system to turn on and off each LED. The photons emitted from each LED may in some embodiments be focused or collimated using an optical element onto a target 1207, 1209, 1211. Furthermore in some embodiments the reflected photons are focused onto the image sensor comprising global shutter pixels.

Figure 13:
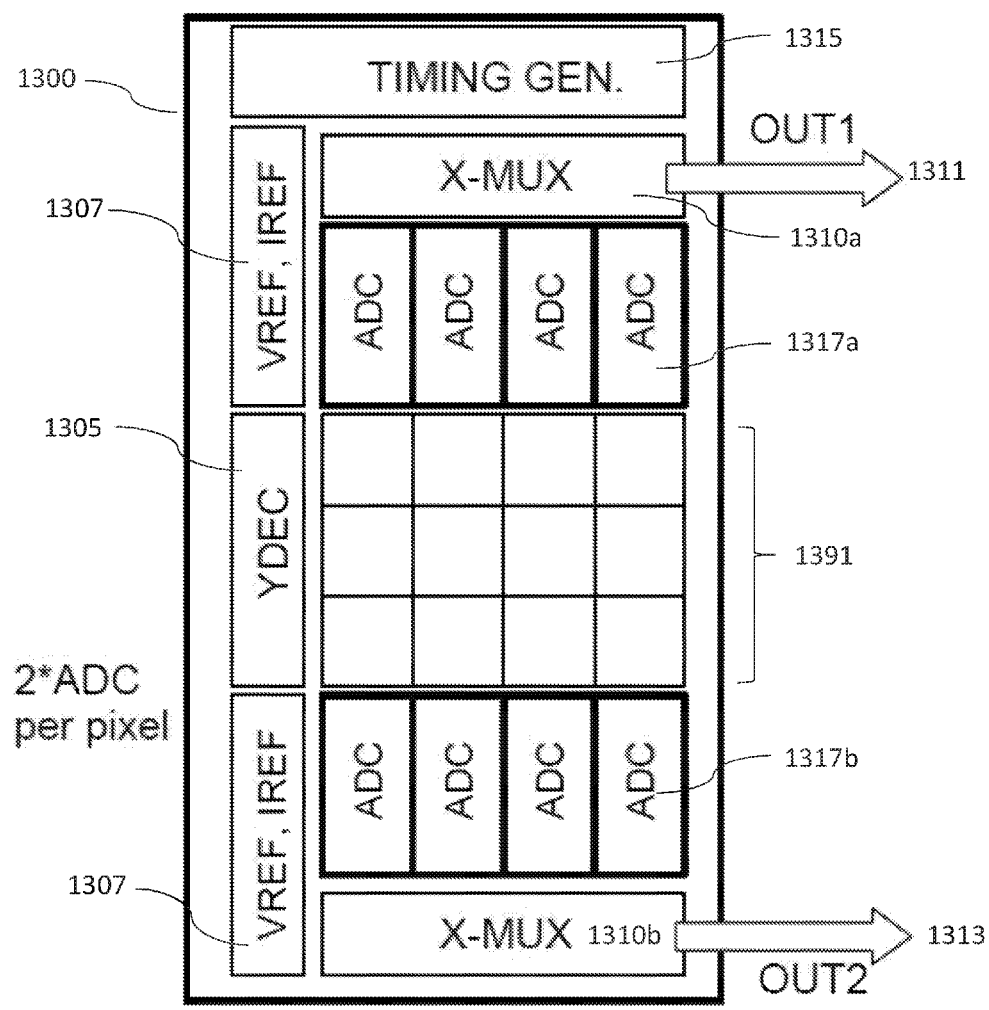
FIG. 13 shows an example dual output-wide ADC sensor arrangement according to some embodiments.

It is understood that the configuration of the image sensor may differ from the examples shown in FIGS. 6, 7 or 9. For example in some embodiments such as shown in FIG. 13 a sensor 1300 is shown which differs from the previous examples in that the pairs of ADCs 1317a, 1317b for each column are split north and south of the image sensor array 1391. The first ADC 1317a is located to the 'north' of the image sensor array 1391 and is coupled to a first X-MUX 1310a and provides a first output 1311. The second ADC 1317b is located to the 'south' of the image sensor array 1391 and is coupled to a second X-MUX 1310b and provide a second output 1313. The sensor may further comprise a voltage and current reference (VREF, IREF) generator 1307 and furthermore a Ydecoder (YDEC) 1305. The Ydecoder (YDEC) 605 can receive signals from the timing generator 1315 to control the sampling period and read out from the pixels.

In some embodiments when a single pixel output Vx line is implemented in a pixel (such as shown in FIG. 5), the readout is time-division multiplexed. An example of which is shown in the system in FIG. 14. The example system shown in FIG. 14 differs from the system in FIG. 12 in that the sensor 1400 comprises pixels with only one output per pixel. A de-interleaving of the output signals from the array may be achieved by the sensor 1400 comprising digital storage ("LINE STORE") 1460. In such embodiments the data from the first readout is analog to digital converted and stored in the digital storage (LINE STORE) 1460 and then the second readout is converted and then readout simultaneously via a first X-MUX 1410a with the data from the digital storage 1460 via a second X-MUX 1410b.

Figure 14:
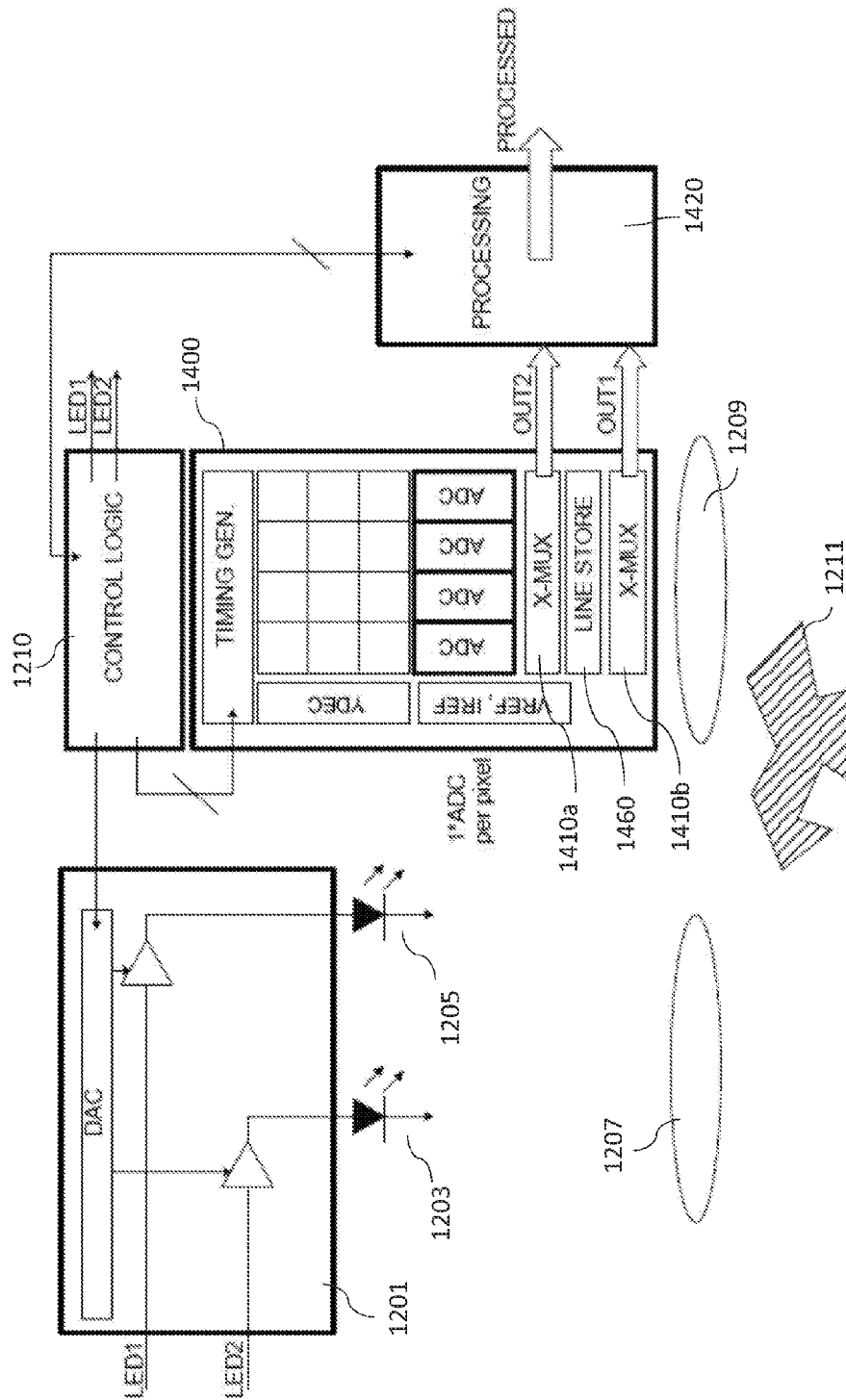
FIG. 14 shows an example 2 LED-Global shutter pixel with internal line storage system according to some embodiments.
Figure 15:
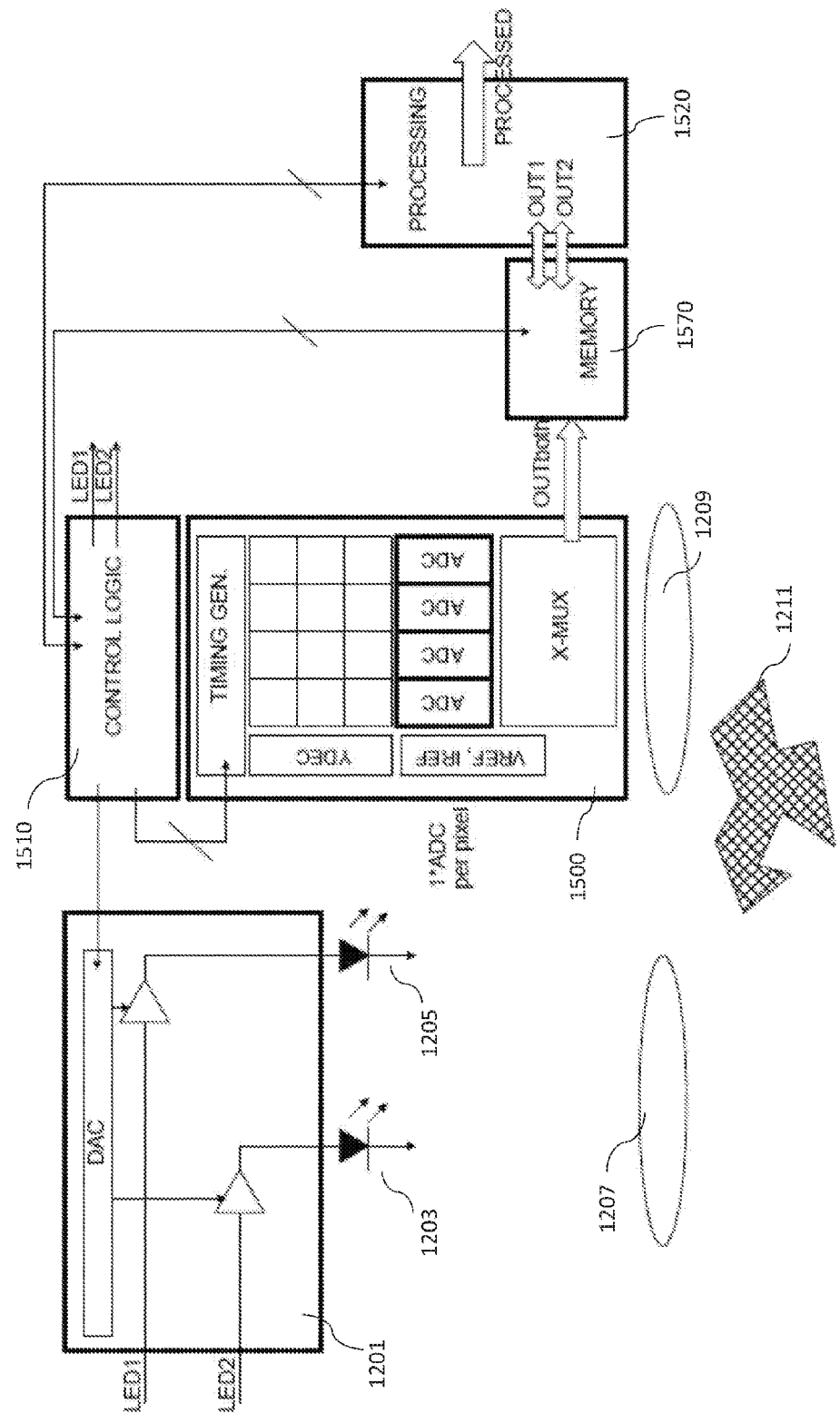
FIG. 15 shows an example 2 LED-Global shutter pixel with external line storage system according to some embodiments.

In some embodiments the digital storage ("LINE STORE") on the device shown in FIG. 14 may be undesirable if a small sensor die is required, e.g., for an endoscope camera. In some embodiments therefore the system comprises an external memory. For example such as shown in FIG. 15 a memory or line store 1570 external to the sensor may be employed to receive both of the outputs from the sensor 1500, and buffer the outputs before passing them to the processor 1520.

Figure 16:
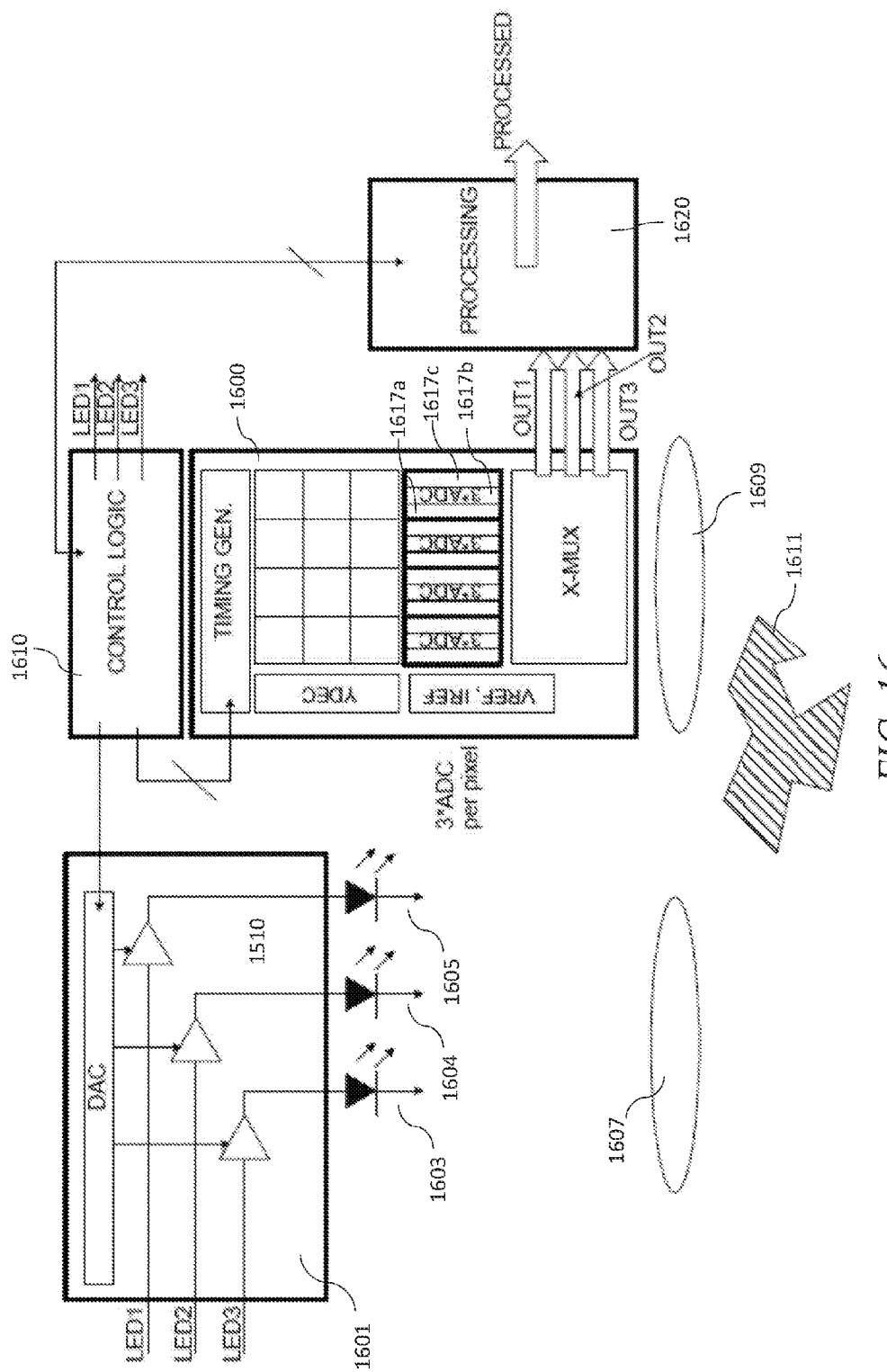
FIG. 16 shows an example 3 LED-Global shutter pixel system according to some embodiments.

In some embodiments a three color system may be implemented. With respect to FIG. 16 a three color imaging sensor system is shown comprising a sensor 1600 similar to those shown in FIGS. 6, 7 or 9 but with a 3 (or 6) part segmentation of the pixel array. For example the array may be divided into first, second and third segments or parts which generate 3 outputs. In some embodiments the sensor comprises 3 (or 6) storage elements to generate 3 outputs per pixel. The outputs from each pixel are passed to an ADC comprising a first 1317a, second 1317b, and third 1317c part, which is then coupled to an X-MUX configured to generate a first, second and third output to a processor 1620. FIG. 16 thus shows a 3 LED with global shutter pixels with 3 outputs per pixel and a narrow ADC. The imaging sensor system may comprise control logic circuitry 1610 for controlling the image capture and processing. The control logic circuitry 1610 may thus be coupled to the sensor 1600 and be configured to control the timing generator within the sensor 1600. The control logic circuitry 1610 may furthermore be configured to generate control signals for a first LED (LED1), a second LED (LED2) and a third LED (LED3) and to a light illumination source driver 1601. The control logic circuitry 1610 may also be coupled to a processor 1620.

The imaging sensor system 1600 comprises a light illumination source driver 1601 which in the example shown in FIG. 16 comprises a digital to analog converter (DAC) which is coupled to a first LED power source controllably powering the first LED 1603, a second LED power source controllably powering a second LED 1604 and also to a third LED power source controllably powering a third LED 1605.

Figure 17:
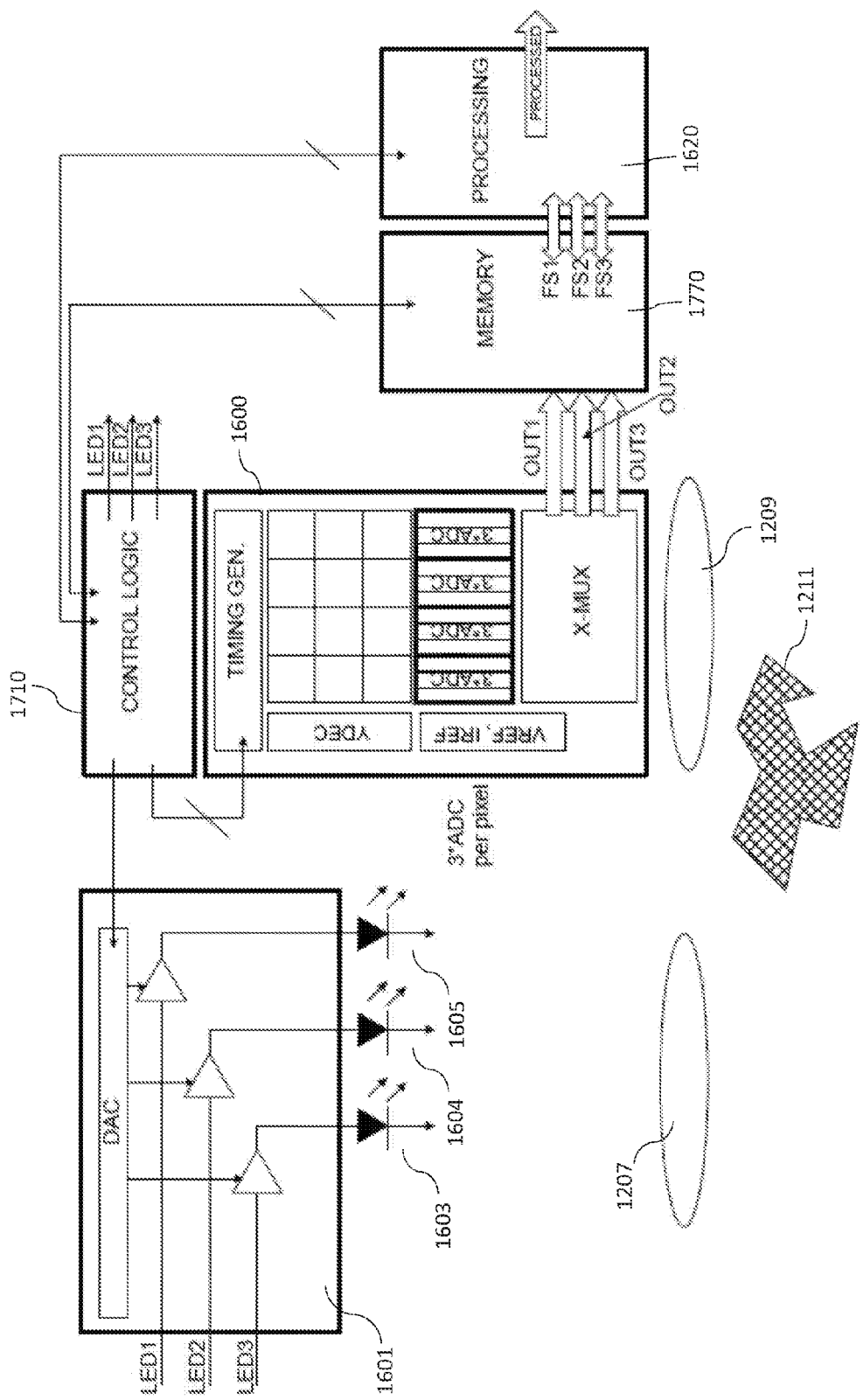
FIG. 17 shows an example 3 LED-Global shutter pixel with external storage system according to some embodiments.
Figure 18:
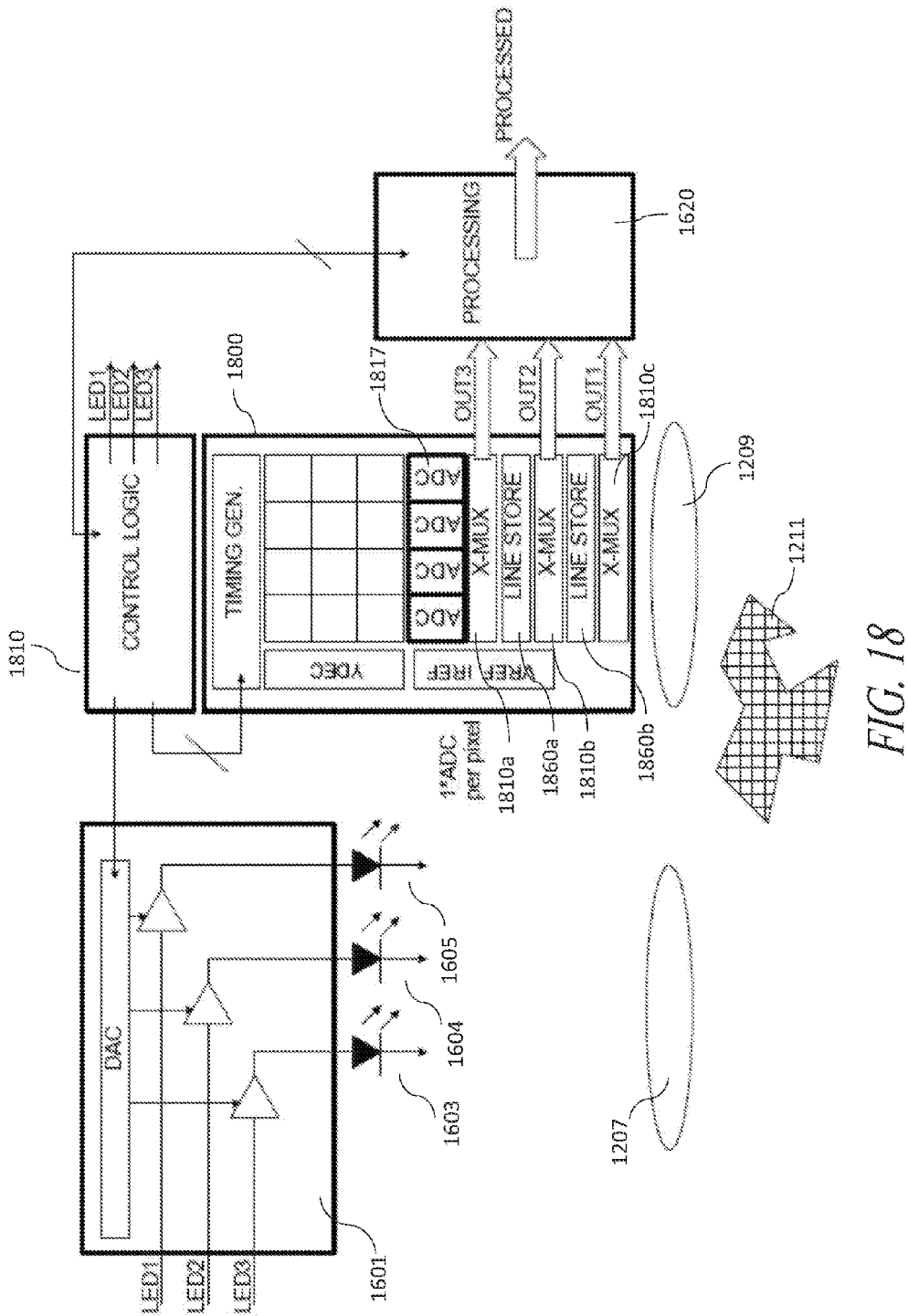
FIG. 18 shows an example 3 LED-Global shutter pixel with internal storage system according to some embodiments.

With respect to FIG. 17 an example three color imaging sensor system is shown where a frame store 1770 is located between the image sensor 1600 and the processor 1620 and controlled by the control logic circuit 1710.

As discussed previously, having 3 outputs and 3 ADCs fitting in the width of each pixel or column may not be possible. In some embodiments the system may comprise a sensor 1800 with a single output bitline from each pixel, a single ADC 1817 configured to supply on-chip storage 1860a, 1860b and three X-MUX parts 1810a, 1810b, 1810c such that all three output signals are available simultaneously. As described previously an external memory or external line store or external frame store may also be employed in some embodiments.

Figure 19:
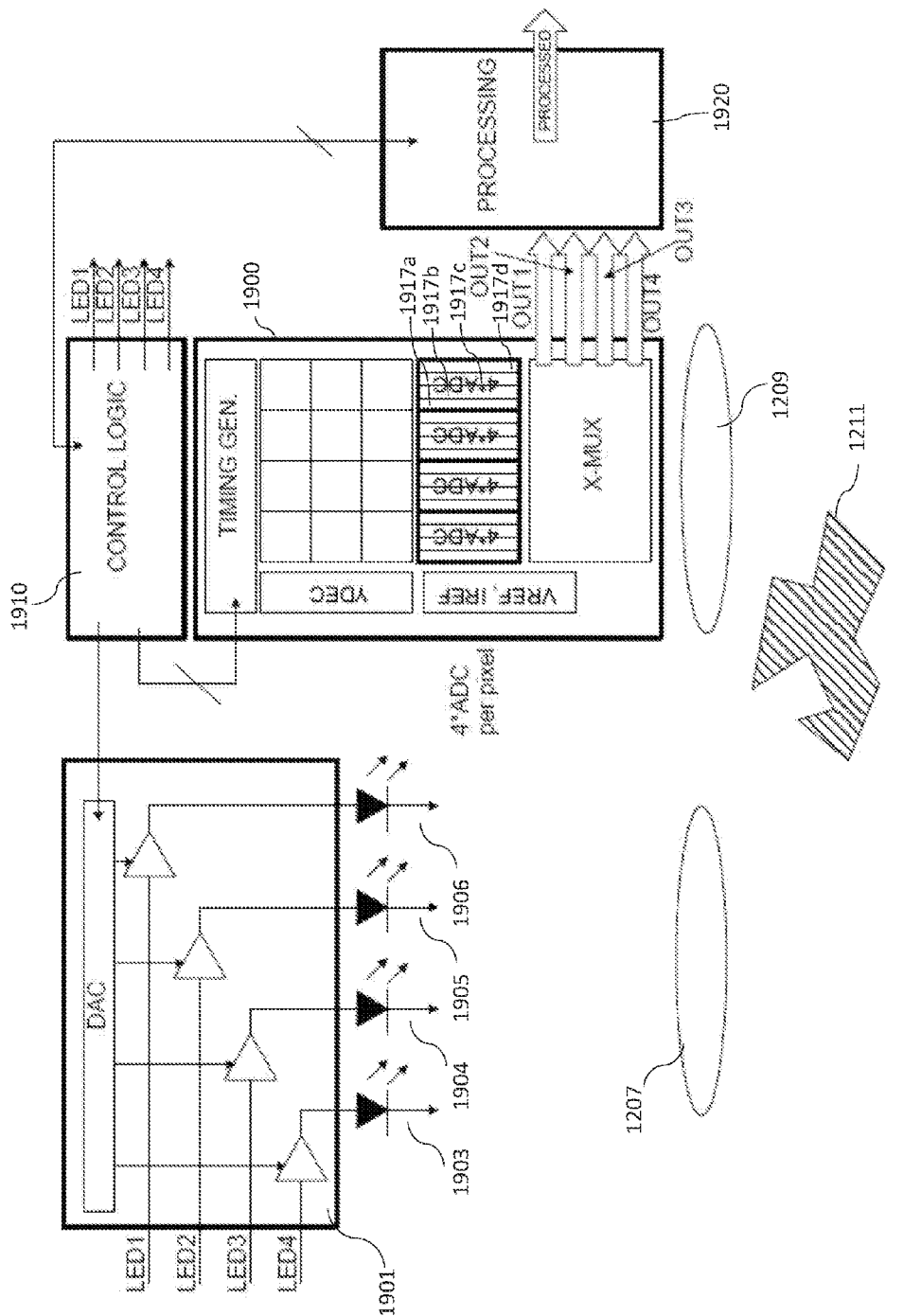
FIG. 19 shows an example 4 LED-Global shutter pixel system according to some embodiments.

FIG. 19 shows an extension to the system shown in FIG. 16. In such embodiments a four color system may be implemented. For certain machine vision applications, a system with four wavelengths may provide a further advantage. The four wavelengths may all be in the visible region, or the system could operate with 3 visible light sources and one outside the visible spectrum (e.g., NIR 700 nm-1000 nm, or NUV 200 nm-400 nm), etc.

With respect to FIG. 19 a four color imaging sensor system is shown comprising a sensor 1900 with each pixel comprising 4 (or 8) storage elements to generate 4 outputs per pixel. The outputs from each pixel are passed to an ADC comprising a first 1917a, second 1917b, third 1917c, and fourth 1917d part, which is then coupled to an X-MUX configured to generate a first, second, third and fourth output to a processor 1920. FIG. 19 thus shows a 4 LED with global shutter pixels with 4 outputs per pixel and a narrow ADC. The imaging sensor system may comprise control logic circuitry 1910 for controlling the image capture and processing. The control logic circuitry 1910 may thus be coupled to the sensor 1900 and be configured to control the timing generator within the sensor 1900. The control logic circuitry 1910 may furthermore be configured to generate control signals for a first LED (LED1), a second LED (LED2), a third LED (LED3), and fourth LED (LED4) and to a light illumination source driver 1901. The control logic circuitry 1910 may also be coupled to a processor 1920.

The imaging sensor system 1900 comprises a light illumination source driver 1901 which in the example shown in FIG. 19 comprises a digital to analog converter (DAC) which is coupled to a first LED power source controllably powering the first LED 1903, a second LED power source controllably powering a second LED 1904, to a third LED power source controllably powering a third LED 1605, and a fourth LED power source controllably powering a fourth LED 1906.

Figure 20:
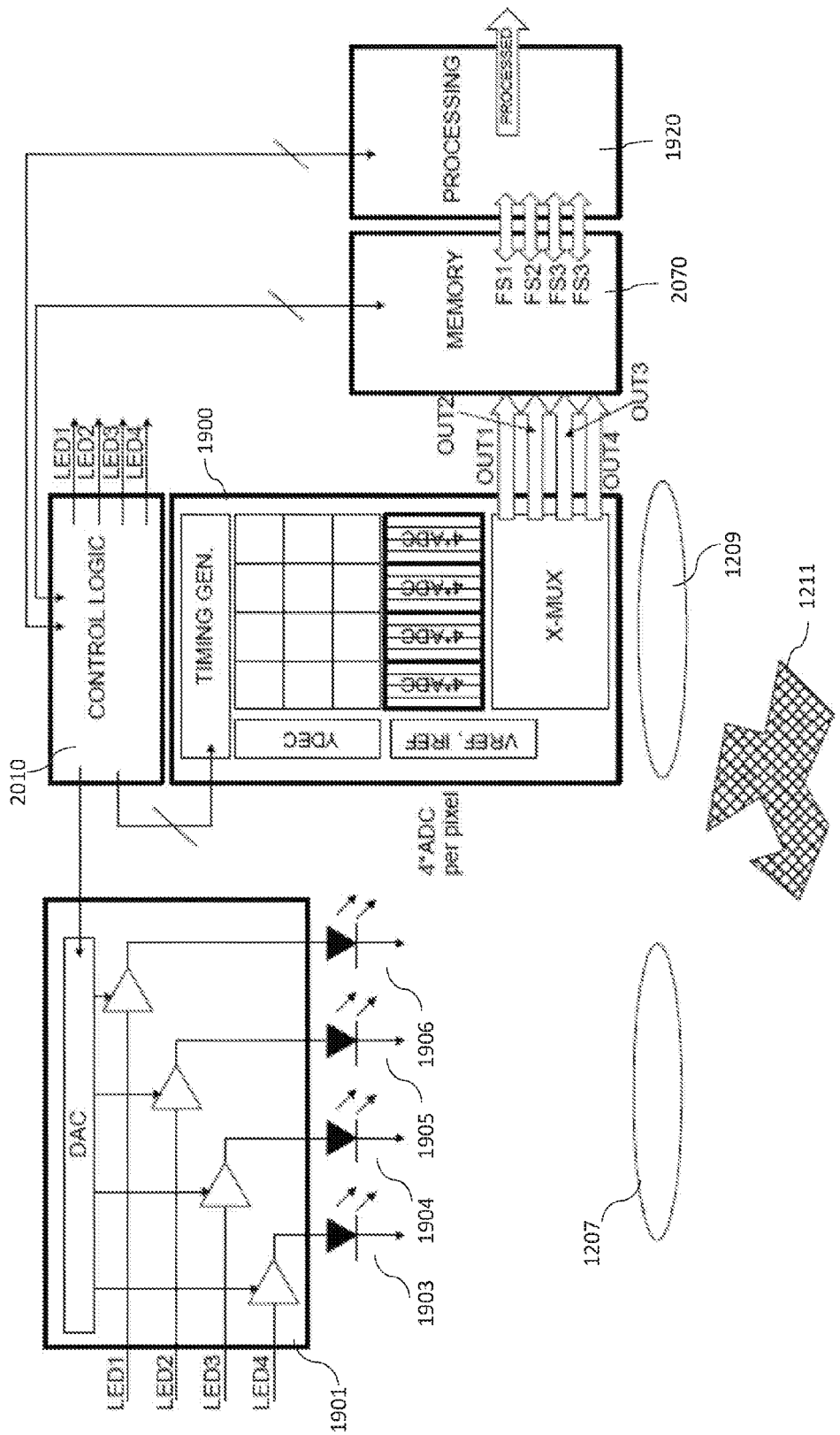
FIG. 20 shows an example 4 LED-Global shutter pixel with external storage system according to some embodiments.

In some embodiments the image sensor system may further comprise a frame store such as shown in FIG. 20, where the system as shown in FIG. 19 is further modified by the insertion of the frame store 2070 between the sensor 1900 and the processor 1920. In some embodiments the frame store may be implemented internally.

Figure 21:
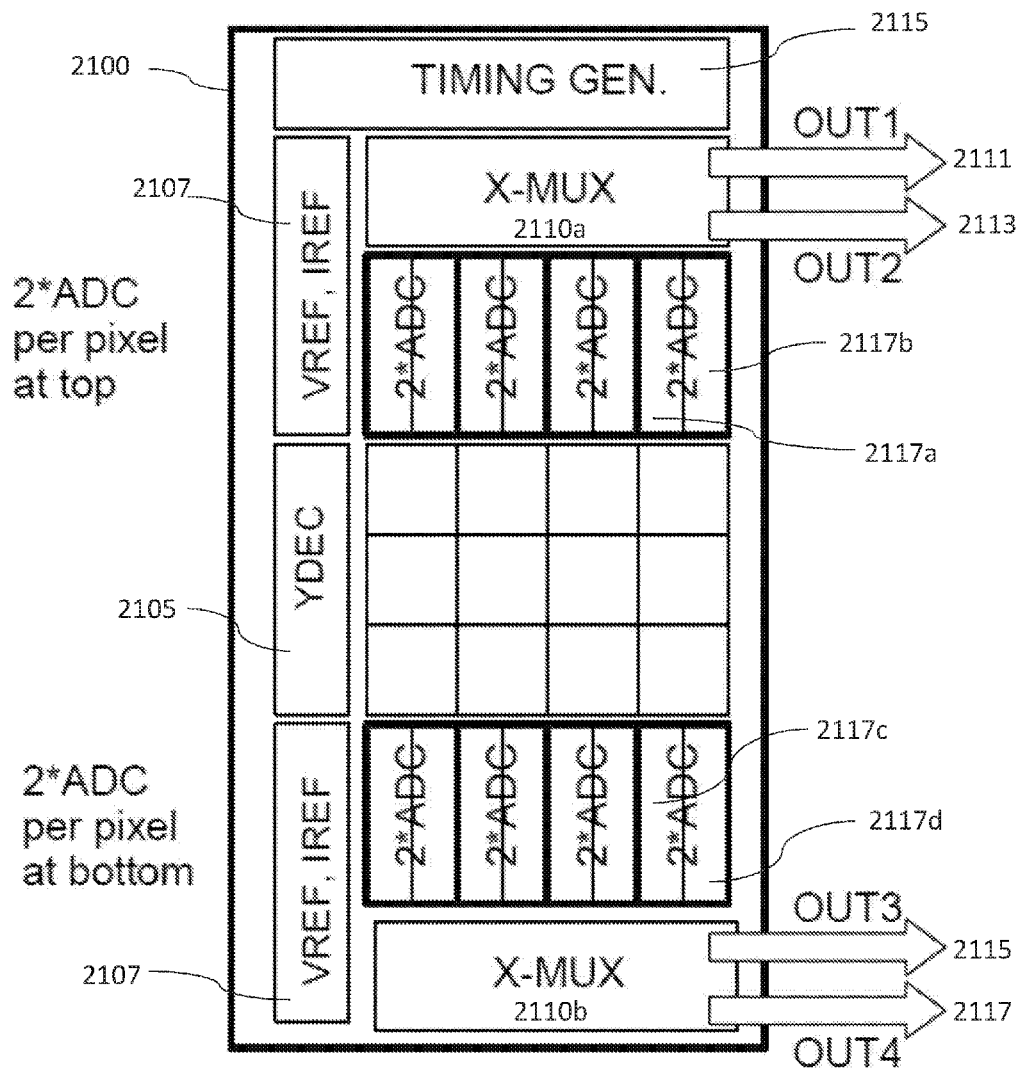
FIG. 21 shows an example quad output-wide ADC sensor arrangement according to some embodiments.

As discussed previously, having 4 outputs and 4 ADCs fitting in the width of each pixel or column may not be possible. In some embodiments the system may comprise a sensor 2100 such as shown in FIG. 21 where the ADC block comprises a first block comprising a first 2117a and second 2117b ADC configured to receive the first and second outputs from the pixel arranged to the north of the pixel array. The first 2117a and second 2117b ADC are coupled to a 'north' X-MUX 2110 to output the first 2111 and second 2113 outputs. The ADC block further comprises a second block comprising a third 2117c and fourth 2117d ADC configured to receive the third and fourth outputs from the pixel arranged to the south of the pixel array. The third 2117c and fourth 2117d ADC are coupled to a 'south' X-MUX 2110b to output the third 2115 and fourth 2119 outputs.

Some embodiments may be provided in an electronic device. It should be appreciated that the device may be any suitable device. By way of example only and without limitation, that device may be a mobile telephone, smart phone, tablet, computer, camera or the like.

In the above reference has been made to particular conductivity types. However in other embodiments, the transistors may be p-type transistors. In some embodiments the implants may be P implants. In some embodiments, a mix of N-type and P-type conductivities may be used.

Various embodiments with different variations have been described here above. It should be noted that those skilled in the art may combine various elements of these various embodiments and variations. Such alterations, modifications, and improvements are intended to be part of this disclosure. Accordingly, the foregoing description is by way of example only and is not intended to be limiting.

Some embodiments may take the form of or comprise computer program products. For example, according to one embodiment there is provided a computer readable medium comprising a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
an array of light-sensitive pixels, each pixel of the array including:
a photodiode; and
a plurality of capacitors configured to store charge from the photodiode; and
an address decoder, coupled to the array of light-sensitive pixels, and which, in at least one mode of operation, controls a plurality of portions of the array of light-sensitive pixels to capture respective image exposures, wherein the address decoder comprises a plurality of row decoders, each row decoder associated with a respective row of the array of light-sensitive pixels and including:
a memory configured to store row-decoder enablement information;
enablement circuitry configured to receive a type signal and to generate an enable signal based on the type signal and the stored row-decoder enablement information; and
address circuitry configured to receive a row-address signal and the enable signal, and to selectively enable the respective row of the array of light sensitive pixels based on the row-address signal and the enable signal.

2. The device of claim 1 wherein the at least one mode of operation comprises at least one of:
a mode of operation wherein the plurality of portions comprise interlaced rows of pixels of the array of light-sensitive pixels; and
a mode of operation wherein the plurality of portions comprise blocks of rows of pixels of the array of light-sensitive pixels.

3. The device of claim 1 wherein the plurality of capacitors comprises one or more of:
a first capacitor configured to store a photodiode charge for a first exposure and a second capacitor configured to store a reset noise charge associated with the first exposure;
a first capacitor configured to store a photodiode charge for a first exposure and a second capacitor configured to store a photodiode charge for a second exposure;
a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and
a first capacitor configured to store a photodiode charge for a first exposure, a second capacitor configured to store a photodiode charge for a second exposure, a third capacitor configured to store a photodiode charge for a third exposure and a fourth capacitor configured to store a photodiode charge for a fourth exposure.

4. The device of claim 1 wherein the array of light-sensitive pixels comprises at least one of:
a global shutter pixel array; and
a rolling blade pixel.

5. A device, comprising:
an array of light-sensitive pixels, each pixel of the array including:
a photodiode; and
a plurality of capacitors configured to store charge from the photodiode; and
an address decoder, coupled to the array of light-sensitive pixels, and which, in at least one mode of operation, controls a plurality of portions of the array of light-sensitive pixels to capture respective image exposures, wherein the address decoder comprises a plurality of row decoders, and wherein neighboring pixels within each row of the array of light-sensitive pixels are controlled by separate row decoders, each row decoder including:
a memory configured to store row-decoder enablement information;
enablement circuitry configured to receive a type signal and to generate an enable signal based on the type signal and the stored row-decoder enablement information; and
address circuitry configured to receive a row-address signal and the enable signal, and to selectively enable pixels of the array of light sensitive pixels controlled by the row decoder based on the row-address signal and the enable signal.

6. The device of claim 5 wherein the at least one mode of operation comprises at least one of:

a mode of operation wherein the plurality of portions comprise interlaced columns of pixels of the array of light-sensitive pixels;
a mode of operation wherein the plurality of portions comprise interlaced columns and rows of pixels of the array of light-sensitive pixels; and
a mode of operation wherein the plurality of portions comprise blocks of columns and rows of pixels of the array of light-sensitive pixels.

7. The device of claim 5 wherein the plurality of capacitors comprises one or more of:
a first capacitor configured to store a photodiode charge for a first exposure and a second capacitor configured to store a reset noise charge associated with the first exposure;
a first capacitor configured to store a photodiode charge for a first exposure and a second capacitor configured to store a photodiode charge for a second exposure;
a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and
a first capacitor configured to store a photodiode charge for a first exposure, a second capacitor configured to store a photodiode charge for a second exposure, a third capacitor configured to store a photodiode charge for a third exposure and a fourth capacitor configured to store a photodiode charge for a fourth exposure.

8. The device of claim 5 wherein the array of light-sensitive pixels comprises at least one of:
a global shutter pixel array; and
a rolling blade pixel.

9. A system, comprising:
an array of light-sensitive pixels, each pixel of the array including:
a photodiode; and
a plurality of capacitors configured to store charge from the photodiode;
a plurality of illumination sources; and
control circuitry, coupled to the array of light-sensitive pixels and the plurality of illumination sources, and which, in at least one mode of operation, controls a plurality of portions of the array of light-sensitive pixels and the plurality of illumination sources to capture respective image exposures, wherein the control circuitry comprises a plurality of row decoders, each row decoder associated with a respective row of the array of light-sensitive pixels and including:
a memory configured to store row-decoder enablement information;
enablement circuitry configured to receive a type signal and to generate an enable signal based on the type signal and the stored row-decoder enablement information; and
address circuitry configured to receive a row-address signal and the enable signal, and to selectively enable the respective row of the array of light sensitive pixels based on the row-address signal and the enable signal.

10. The system of claim 9 wherein each illumination source of the plurality of illumination sources is associated with a separate wavelength range.

11. The system of claim 9 wherein the at least one mode of operation comprises at least one of:

a mode of operation wherein the plurality of portions comprise interlaced rows of pixels of the array of light-sensitive pixels; and a mode of operation wherein the plurality of portions comprise blocks of rows of pixels of the array of light-sensitive pixels.

12. The system of claim 9 wherein the plurality of capacitors comprises one or more of:
a first capacitor configured to store a photodiode charge for a first exposure and a second capacitor configured to store a reset noise charge associated with the first exposure;
a first capacitor configured to store a photodiode charge for a first exposure and a second capacitor configured to store a photodiode charge for a second exposure;
a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and
a first capacitor configured to store a photodiode charge for a first exposure, a second capacitor configured to store a photodiode charge for a second exposure, a third capacitor configured to store a photodiode charge for a third exposure and a fourth capacitor configured to store a photodiode charge for a fourth exposure.

13. A system, comprising:
an array of light-sensitive pixels, each pixel of the array including:
a photodiode; and
a plurality of capacitors configured to store charge from the photodiode;
a plurality of illumination sources; and
control circuitry, coupled to the array of light-sensitive pixels and the plurality of illumination sources, and which, in at least one mode of operation, controls a plurality of portions of the array of light-sensitive pixels and the plurality of illumination sources to capture respective image exposures, wherein the control circuitry comprises a plurality of row decoders, and wherein neighboring pixels within each row of the array of light-sensitive pixels are controlled by separate row decoders, each row decoder including:
a memory configured to store row-decoder enablement information;
enablement circuitry configured to receive a type signal and to generate an enable signal based on the type signal and the stored row-decoder enablement information; and
address circuitry configured to receive a row-address signal and the enable signal, and to selectively enable pixels of the array of light sensitive pixels controlled by the row decoder based on the row-address signal and the enable signal.

14. The system of claim 13 wherein the at least one mode of operation comprises at least one of:
a mode of operation wherein the plurality of portions comprise interlaced columns of pixels of the array of light-sensitive pixels;
a mode of operation wherein the plurality of portions comprise interlaced columns and rows of pixels of the array of light-sensitive pixels; and
a mode of operation wherein the plurality of portions comprise blocks of columns and rows of pixels of the array of light-sensitive pixels.

15. The system of claim 13 wherein the plurality of capacitors comprises one or more of:
a first capacitor configured to store a photodiode charge for a first exposure and a second capacitor configured to store a reset noise charge associated with the first exposure;
a first capacitor configured to store a photodiode charge for a first exposure and a second capacitor configured to store a photodiode charge for a second exposure;
a first capacitor configured to store a photodiode charge for a first exposure, a second capacitor configured to store a reset noise charge associated with the first exposure, a third capacitor configured to store a photodiode charge for a second exposure and a fourth capacitor configured to store a reset noise charge associated with the second exposure; and
a first capacitor configured to store a photodiode charge for a first exposure, a second capacitor configured to store a photodiode charge for a second exposure, a third capacitor configured to store a photodiode charge for a third exposure and a fourth capacitor configured to store a photodiode charge for a fourth exposure.

16. A method, comprising:
controlling, using an address decoder, a plurality of portions of an array of light-sensitive pixels to respectively capture a plurality of image exposures, each pixel of the array including:
a photodiode; and
a plurality of capacitors configured to store charge from the photodiode; and
storing the captured plurality of image exposures, wherein the address decoder comprises a plurality of row decoders, each row decoder associated with a respective row of the array of light-sensitive pixels and including:
a memory configured to store row-decoder enablement information;
enablement circuitry configured to receive a type signal and to generate an enable signal based on the type signal and the stored row-decoder enablement information; and
address circuitry configured to receive a row-address signal and the enable signal, and to selectively enable the respective row of the array of light sensitive pixels based on the row-address signal and the enable signal.

17. The method of claim 16 wherein the plurality of portions comprise at least one of:
interlaced rows of pixels of the array of light-sensitive pixels; and
blocks of rows of pixels of the array of light-sensitive pixels.

18. The method of claim 16 wherein the plurality of portions comprise at least one of:
interlaced columns of pixels of the array of light-sensitive pixels;
interlaced columns and rows of pixels of the array of light-sensitive pixels; and
blocks of columns and rows of pixels of the array of light-sensitive pixels.

19. The method of claim 16, comprising at least one of:
storing a photodiode charge for a first exposure to a first capacitor of a pixel and storing a reset noise charge associated with the first exposure to a second capacitor of the pixel; and storing the photodiode charge for the first exposure to the first capacitor of the pixel and storing a photodiode charge for a second exposure to a second capacitor of the pixel.

20. The method of claim 16, comprising:
controlling a plurality of illumination sources during the capturing of the plurality of image exposures.

21. A method, comprising:
controlling, using an address decoder, a plurality of portions of an array of light-sensitive pixels to respectively capture a plurality of image exposures, each pixel of the array including:
 a photodiode; and
 a plurality of capacitors configured to store charge from the photodiode; and
storing the captured plurality of image exposures, wherein the address decoder comprises a plurality of row decoders, and wherein neighboring pixels within each row of the array of light-sensitive pixels are controlled by separate row decoders, each row decoder including:
 a memory configured to store row-decoder enablement information;
 enablement circuitry configured to receive a type signal and to generate an enable signal based on the type signal and the stored row-decoder enablement information; and
 address circuitry configured to receive a row-address signal and the enable signal, and to selectively enable pixels of the array of light sensitive pixels controlled by the row decoder based on the row-address signal and the enable signal.

22. The method of claim 21 wherein the plurality of portions comprise at least one of:
 interlaced rows of pixels of the array of light-sensitive pixels; and
 blocks of rows of pixels of the array of light-sensitive pixels.

23. The method of claim 21 wherein the plurality of portions comprise at least one of:
 interlaced columns of pixels of the array of light-sensitive pixels;
 interlaced columns and rows of pixels of the array of light-sensitive pixels; and
 blocks of columns and rows of pixels of the array of light-sensitive pixels.

24. The method of claim 21, comprising at least one of:
 storing a photodiode charge for a first exposure to a first capacitor of a pixel and storing a reset noise charge associated with the first exposure to a second capacitor of the pixel; and
 storing the photodiode charge for the first exposure to the first capacitor of the pixel and storing a photodiode charge for a second exposure to a second capacitor of the pixel.

25. The method of claim 21, comprising:
controlling a plurality of illumination sources during the capturing of the plurality of image exposures.

* * * * *